United States Patent
Chitnis et al.

(10) Patent No.: US 8,877,524 B2
(45) Date of Patent: Nov. 4, 2014

(54) EMISSION TUNING METHODS AND DEVICES FABRICATED UTILIZING METHODS

(75) Inventors: Ashay Chitnis, Santa Barbara, CA (US); John Edmond, Cary, NC (US); Jeffrey Carl Britt, Cary, NC (US); Bernd P. Keller, Santa Barbara, CA (US); David Todd Emerson, Chapel Hill, NC (US); Michael John Bergmann, Chapel Hill, NC (US); Jasper S. Cabalu, Cary, NC (US)

(73) Assignee: Cree, Inc., Goleta, CA (US)

( * ) Notice: Subject to any disclaimer, the term of this patent is extended or adjusted under 35 U.S.C. 154(b) by 0 days.

(21) Appl. No.: 12/414,457

(22) Filed: Mar. 30, 2009

(65) Prior Publication Data

US 2009/0261358 A1  Oct. 22, 2009

Related U.S. Application Data

(60) Provisional application No. 61/072,546, filed on Mar. 31, 2008.

(51) Int. Cl.
   *H01L 21/66* (2006.01)
   *H01L 33/00* (2010.01)
   *H01L 33/50* (2010.01)

(52) U.S. Cl.
   CPC .......... *H01L 33/508* (2013.01); *H01L 33/0095* (2013.01); *H01L 2933/0041* (2013.01)
   USPC ................. 438/14; 438/16; 438/62

(58) Field of Classification Search
   USPC .................... 438/14, 16, 20, 22, 62
   See application file for complete search history.

(56) References Cited

U.S. PATENT DOCUMENTS

| 4,946,547 A | 8/1990 | Palmour et al. ............... 156/643 |
| 5,200,022 A | 4/1993 | Kong et al. .................... 156/612 |

(Continued)

FOREIGN PATENT DOCUMENTS

| EP | 1059678 | 12/2000 |
| EP | 1138747 A2 | 10/2001 |

(Continued)

OTHER PUBLICATIONS

Nichia Corp. White LED Part Nos. NSPW300BS and NSPW312BS, 2004, Data sheets.

(Continued)

*Primary Examiner* — Jack Chen
(74) *Attorney, Agent, or Firm* — Koppel, Patrick, Heybl & Philpott

(57) ABSTRACT

A method for fabricating light emitting diode (LED) chips comprising providing a plurality of LEDs, typically on a wafer, and coating the LEDs with a conversion material so that at least some light from the LEDs passes through the conversion material and is converted. The light emission from the LED chips comprises light from the conversion material, typically in combination with LED light. The emission characteristics of at least some of the LED chips is measured and at least some of the conversion material over the LEDs is removed to alter the emission characteristics of the LED chips. The invention is particularly applicable to fabricating LED chips on a wafer where the LED chips have light emission characteristics that are within a range of target emission characteristics. This target range can fall within an emission region on a CIE curve to reduce the need for binning of the LEDs from the wafer. The emission characteristics of the LED chips in the wafer can be tuned to the desired range by micro-machining the conversion material over the LEDs.

20 Claims, 10 Drawing Sheets

(56) References Cited

U.S. PATENT DOCUMENTS

| | | | |
|---|---|---|---|
| RE34,861 E | 2/1995 | Davis et al. | 437/100 |
| 5,813,753 A | 9/1998 | Vriens et al. | 362/293 |
| 5,959,316 A | 9/1999 | Lowery | |
| 6,395,564 B1 | 5/2002 | Huang et al. | |
| 6,483,196 B1 | 11/2002 | Wojnarowski et al. | 257/778 |
| 6,577,073 B2 | 6/2003 | Shimizu et al. | |
| 6,598,998 B2 | 7/2003 | West et al. | 362/307 |
| 6,610,563 B1 | 8/2003 | Waitl et al. | 438/166 |
| 6,746,295 B2 | 6/2004 | Sorg | 445/24 |
| 6,841,934 B2 | 1/2005 | Wang et al. | 313/512 |
| 6,860,621 B2 | 3/2005 | Bachl et al. | 362/373 |
| 7,049,159 B2 | 5/2006 | Lowery | 438/22 |
| 7,083,490 B2 | 8/2006 | Mueller et al. | 445/24 |
| 7,126,273 B2 | 10/2006 | Sorg | 313/512 |
| 7,176,612 B2 | 2/2007 | Omoto et al. | 313/487 |
| 7,195,944 B2 | 3/2007 | Tran et al. | 438/46 |
| 7,260,123 B2 | 8/2007 | Sato | 372/22 |
| 7,286,926 B2 | 10/2007 | Gotah et al. | 701/114 |
| 7,361,938 B2 | 4/2008 | Mueller et al. | 257/94 |
| 7,371,603 B2 | 5/2008 | Kim et al. | 438/64 |
| 7,510,890 B2 | 3/2009 | Ott et al. | 438/29 |
| 7,646,035 B2 | 1/2010 | Loh et al. | 257/99 |
| 7,655,957 B2 | 2/2010 | Loh et al. | 257/99 |
| 7,804,103 B1 | 9/2010 | Zhai et al. | 257/98 |
| 7,858,403 B2 | 12/2010 | Hiller et al. | |
| 7,910,938 B2 | 3/2011 | Hussell et al. | 257/98 |
| 7,994,531 B2 | 8/2011 | Lin et al. | 257/98 |
| 8,207,546 B2 | 6/2012 | Harada et al. | 257/98 |
| 2002/0070449 A1 | 6/2002 | Yagi et al. | |
| 2002/0171911 A1 | 11/2002 | Maegawa | |
| 2003/0089918 A1 | 5/2003 | Hiller et al. | |
| 2003/0141510 A1 | 7/2003 | Brunner et al. | 257/81 |
| 2004/0080939 A1 | 4/2004 | Braddell et al. | |
| 2004/0124429 A1 | 7/2004 | Stokes et al. | |
| 2004/0264193 A1 | 12/2004 | Okumura | 362/276 |
| 2005/0057813 A1 | 3/2005 | Hasei et al. | |
| 2005/0122031 A1 | 6/2005 | Itai et al. | |
| 2005/0135105 A1 | 6/2005 | Teixeira et al. | 362/294 |
| 2005/0224829 A1 | 10/2005 | Negley et al. | 257/99 |
| 2005/0280894 A1 | 12/2005 | Hartkop et al. | 359/464 |
| 2006/0001046 A1 | 1/2006 | Batres et al. | 257/202 |
| 2006/0003477 A1 | 1/2006 | Braune et al. | |
| 2006/0034082 A1 | 2/2006 | Park et al. | |
| 2006/0049411 A1 | 3/2006 | Nakamura et al. | |
| 2006/0060874 A1 | 3/2006 | Edmond et al. | |
| 2006/0060877 A1 | 3/2006 | Edmond et al. | |
| 2006/0102914 A1 | 5/2006 | Smits et al. | 257/98 |
| 2006/0186418 A1 | 8/2006 | Edmond et al. | |
| 2006/0189098 A1 | 8/2006 | Edmond | |
| 2006/0258028 A1* | 11/2006 | Paolini et al. | 438/22 |
| 2007/0018573 A1 | 1/2007 | Shioi | |
| 2007/0041101 A1 | 2/2007 | Goosey et al. | 359/676 |
| 2007/0165403 A1 | 7/2007 | Park | 362/247 |
| 2007/0295975 A1 | 12/2007 | Omae | 257/89 |
| 2008/0173884 A1 | 7/2008 | Chitnis et al. | 257/98 |
| 2008/0179611 A1 | 7/2008 | Chitnis et al. | 257/98 |
| 2009/0014736 A1 | 1/2009 | Ibbetson et al. | 257/98 |
| 2009/0057690 A1 | 3/2009 | Chakraborty | |
| 2009/0065791 A1 | 3/2009 | Yen et al. | 257/98 |
| 2009/0086475 A1 | 4/2009 | Caruso et al. | 362/231 |
| 2009/0117672 A1 | 5/2009 | Caruso et al. | |
| 2009/0261358 A1 | 10/2009 | Chitnis et al. | 257/88 |
| 2010/0155750 A1 | 6/2010 | Donofrio | 257/91 |
| 2010/0308361 A1 | 12/2010 | Beeson et al. | 257/98 |
| 2011/0070668 A1 | 3/2011 | Hiller et al. | |
| 2011/0070669 A1 | 3/2011 | Hiller et al. | |
| 2011/0180829 A1 | 7/2011 | Cho | |

FOREIGN PATENT DOCUMENTS

| | | |
|---|---|---|
| EP | 1198016 A2 | 10/2001 |
| EP | 1198016 | 4/2002 |
| JP | H0428269 | 1/1992 |
| JP | 11040848 | 2/1999 |
| JP | H1140848 | 2/1999 |
| JP | 2000315823 | 11/2000 |
| JP | 2002009347 | 1/2002 |
| JP | 2004179343 | 6/2004 |
| JP | 2004363343 | 12/2004 |
| JP | 2005508093 | 3/2005 |
| JP | 2005298817 | 10/2005 |
| JP | 2006054209 | 2/2006 |
| JP | 2006303303 | 11/2006 |
| JP | 2006303373 | 11/2006 |
| JP | 2007324608 | 12/2007 |
| WO | WO2005101909 | 10/2005 |
| WO | WO 2006121197 A | 11/2006 |
| WO | WO2007049187 | 5/2007 |

OTHER PUBLICATIONS

CREE® Inc. EZBright™ LED Chips EZ1000, EZ700, EZ400 and EZ290 data sheets.2007.
CREE® Inc. XThin™ LEDs, pp. 1-6, 2004 data sheets.
M-501 Precision Vertical Micropositioning Z-Stage, by PI, 1998.
U.S. Appl. No. 11/656,759, filed Jan. 22, 2007.
U.S. Appl. No. 11/899,790, filed Sep. 7, 2007.
International Search Report and Written Opinion from related PCT application No. PCT/US2009/002039, dated; Dec. 22, 2009.
Nichia Corp. White LED, Part No. NSPW312BS, "Specifications for Nichia White LED, Model NSPW312BS," pp. 1-14, 2004.
Nichia Corp. White LED, Part No. NSPW300BS, "Specifications for Nichia White LED, Model NSPW300BS," pp. 1-14, 2004.
Third Office Action from Chinese Patent Appl. No. 2007800123870, dated Feb. 14, 2013.
Second Office Action from Chinese Patent Application No. 200780012387.0. dated Sep. 5, 2012.
First Office Action for European Patent Application No. 07754163.9 dated Feb. 28, 2011.
Notice of Rejection for Japanese Patent Application No. 2009-504205 issued Sep. 13, 2011.
Notice of Reasons for Rejection from Japanese Patent Application No. 2011-502981, dated Feb. 5, 2013.
Office Action from Korean Patent Application No. 10-2008-7026531, dated Feb. 14, 2013.
Second Office Action from Chinese Application No. 200980121201.4, Dated: Mar. 5, 2013.
Interrogatory from Japanese Patent Appl. No. 2009-504205, dated Mar. 19, 2013.
Decision of Rejection for Japanese Patent Application No. 2009-504205, dated Jul. 31, 2012.
First Office Action from Chinese Patent Application No. 200980121201.4, dated Jul. 4, 2012.
International Search Report and Written Opinion from PCT Appl. No. PCT/US2012/050794, dated Jan. 10, 2013.
Rejection Decision from Chinese Patent Appl. No. 200980121201.4, received Sep. 23, 2013.
Decision of Rejection from Japanese Patent Appl. No. 2011-502981, dated Sep. 10, 2013.
Examination Report from European Patent Appl. No. 07 754 163.9-1564, dated Oct. 14, 2013.
Office Action from U.S. Appl. No. 11/775,958, dated Oct. 24, 2013.
Office Action from U.S. Appl. No. 11/398,214, dated Jun. 10, 2013.
Office Action from U.S. Appl. No. 11/775,958, dated Apr. 8, 2013.
Office Action from U.S. Appl. No. 11/827,626, dated Mar. 27, 2013.
Response to OA from U.S. Appl. No. 11/827,626, filed Jun. 20, 2013.
Office Action from U.S. Appl. No. 13/192,293, dated Mar. 27, 2013.
Response to OA from U.S. Appl. No. 13/192,293, filed Jun. 20, 2013.
Office Action from U.S. Appl. No. 13/219,486, dated Feb. 8, 2013.
Response to OA from U.S. Appl. No. 13/219,486, filed May 2, 2013.
Office Action from U.S. Appl. No. 11/827,626, dated Dec. 19, 2012.
Response to OA from U.S. Appl. No. 11/827,626, filed Feb. 8, 2013.
Office Action from U.S. Appl. No. 11/827,626, dated Sep. 17, 2012.
Response to OA from U.S. Appl. No. 11/827,626, filed Dec. 4, 2012.
Office Action from U.S. Appl. No. 13/219,486, dated Aug. 21, 2012.
Response to OA from U.S. Appl. No. 13/219,486, filed Dec. 18, 2012.
Office Action from U.S. Appl. No. 13/219,486, dated Apr. 19, 2012.
Response to OA from U.S. Appl. No. 13/219,486, filed Jul. 12, 2012.

(56) References Cited

OTHER PUBLICATIONS

Office Action from U.S. Appl. No. 11/827,626, dated Sep. 28, 2011.
Response to OA from U.S. Appl. No. 11/827,626, filed Feb. 22, 2012.
Office Action from U.S. Appl. No. 11/398,214, dated Apr. 25, 2011.
Response to OA from U.S. Appl. No. 11/398,214, filed Aug. 23, 2011.
Office Action from Taiwanese Patent Appl. No. 096111808. dated Nov. 7, 2013.
Extended European Search Report from European Patent Appl. No. 08160051.2-1551, dated Apr. 24, 2014.
Office Action from U.S. Appl. No. 11/398,214, dated Nov. 22, 2013.
Response to OA from U.S. Appl. No. 11/398,214, filed Jan. 14, 2014.
Office Action from U.S. Appl. No. 11/398,214, dated Mar. 7, 2014.
Allowed Claims from Taiwanese Patent Appl. No. 096111808, dated Jun. 6, 2014.
Office Action from U.S. Appl. No. 11/827.626, dated Jun. 12, 2014.
Response to OA from U.S. Appl. No. 11/827,626, filed Aug. 8, 2014.
Office Action from U.S. Appl. No. 11/398,214, dated Jun. 12, 2014.
Examination Report from European Patent Appl. No. 09728238.8, dated Aug. 6, 2014.

* cited by examiner

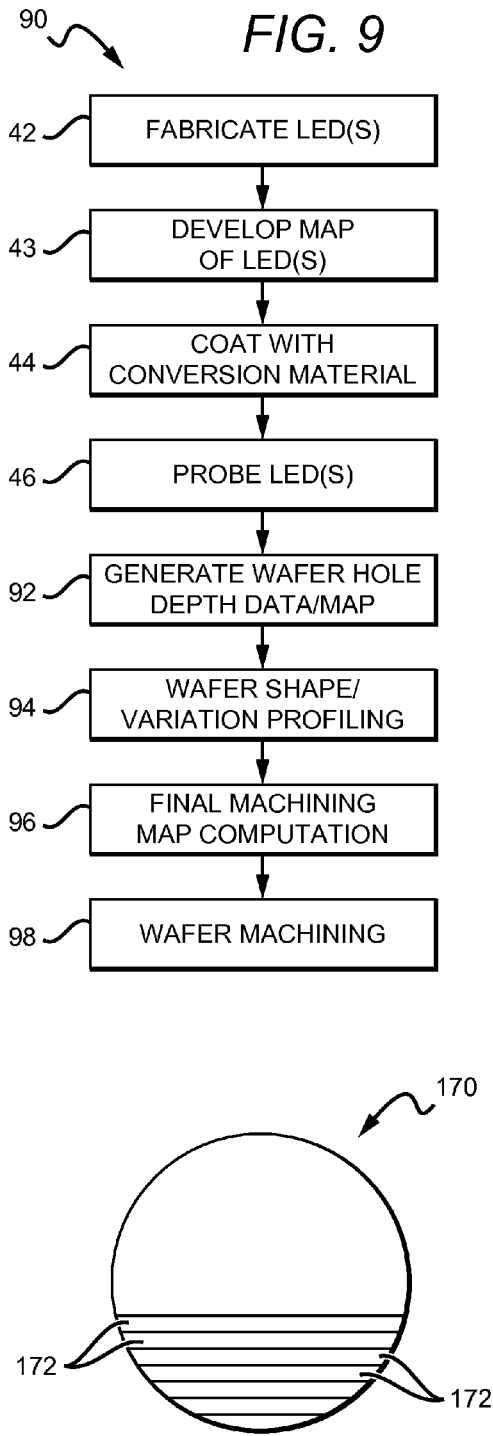
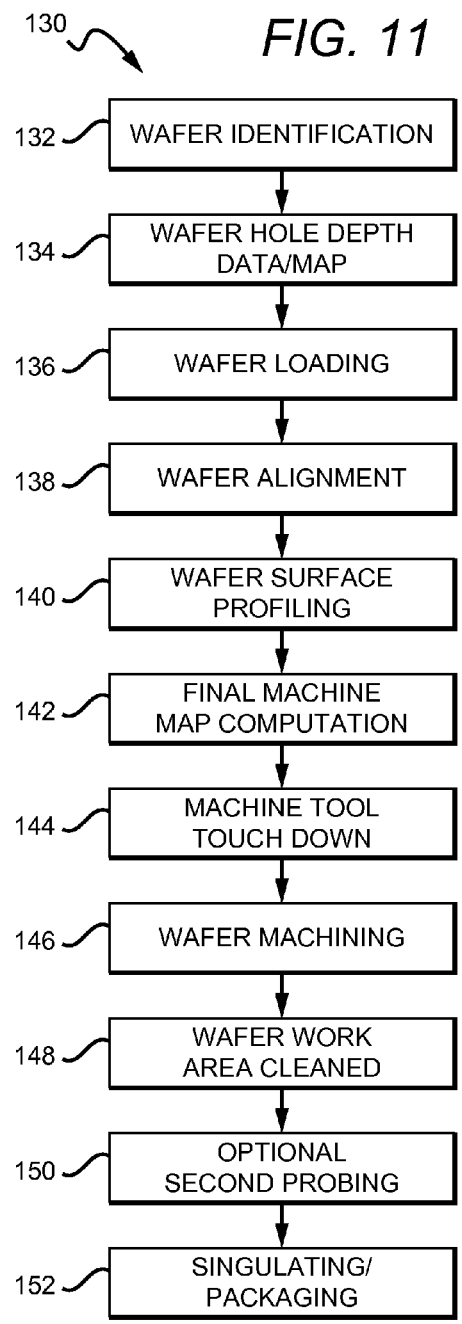

EMISSION TUNING METHODS AND DEVICES FABRICATED UTILIZING METHODS

This application claims the benefit of U.S. Provisional Patent Application Ser. No. 61/072,546 to Chitnis et al., filed on Mar. 31, 2008.

BACKGROUND OF THE INVENTION

1. Field of the Invention

This invention relates to methods for fabricating sold state emitters and in particular methods for tuning the emission characteristics of light emitting diodes coated by a conversion material.

2. Description of the Related Art

Light emitting diodes (LED or LEDs) are solid state devices that convert electric energy to light, and generally comprise one or more active layers of semiconductor material sandwiched between oppositely doped layers. When a bias is applied across the doped layers, holes and electrons are injected into the active layer where they recombine to generate light. Light is emitted from the active layer and from all surfaces of the LED.

Conventional LEDs cannot generate white light from their active layers. Light from a blue emitting LED has been converted to white light by surrounding the LED with a yellow phosphor, polymer or dye, with a typical phosphor being cerium-doped yttrium aluminum garnet (Ce:YAG). [See Nichia Corp. white LED, Part No. NSPW300BS, NSPW312BS, etc.; Cree® Inc. EZBright™ LEDs, XThin™ LEDs, etc.; See also U.S. Pat. No. 5,959,316 to Lowrey, "Multiple Encapsulation of Phosphor-LED Devices"]. The surrounding phosphor material "downconverts" the wavelength of some of the LED's blue light, changing its color to yellow. Some of the blue light passes through the phosphor without being changed while a substantial portion of the light is downconverted to yellow. The LED emits both blue and yellow light, which combine to provide a white light. In another approach light from a violet or ultraviolet emitting LED has been converted to white light by surrounding the LED with multicolor phosphors or dyes.

One conventional method for coating an LED with a phosphor layer utilizes a syringe or nozzle for injecting a conversion material (e.g. phosphor) mixed with epoxy resin or silicone polymers over the LED. Using this method, however, the phosphor layer's geometry and thickness can be difficult to control. As a result, light emitting from different coated LEDs can vary, and light emitted at different angles can pass through different amounts of conversion material, which can result in an LED with non-uniform color temperature as a function of viewing angle. Because the geometry and thickness is hard to control, it can also be difficult to consistently reproduce LEDs with the same or similar emission characteristics.

Another conventional method for coating an LED is by stencil printing, which is described in European Patent Application EP 1198016 A2 to Lowery. Multiple light emitting semiconductor devices are arranged on a substrate with a desired distance between adjacent LEDs. The stencil is provided having openings that align with the LEDs, with the holes being slightly larger than the LEDs and the stencil being thicker than the LEDs. A stencil is positioned on the substrate with each of the LEDs located within a respective opening in the stencil. A composition is then deposited in the stencil openings, covering the LEDs, with a typical composition being a phosphor in a silicone polymer that can be cured by heat or light. After the holes are filled, the stencil is removed from the substrate and the stenciling composition is cured to a solid state.

Like the syringe method above, using the stencil method it can be difficult to control the geometry and layer thickness of the phosphor containing polymer. The stenciling composition may not fully fill the stencil opening such that the resulting layer is not uniform. The phosphor containing composition can also stick to the stencil opening which reduces the amount of composition remaining on the LED. The stencil openings may also be misaligned to the LED. These problems can result in LEDs having non-uniform color temperature and LEDs that are difficult to consistently reproduce with the same or similar emission characteristics.

Various coating processes of LEDs have been considered, including spin coating, spray coating, electrostatic deposition (ESD), and electrophoretic deposition (EPD). Processes such as spin coating or spray coating typically utilize a binder material during the phosphor deposition, while other processes require the addition of a binder immediately following their deposition to stabilize the phosphor particles/powder.

There has been recent interest in coating LEDs at the wafer level instead of the chip level to reduce the cost and complexity of fabrication. LEDs across a wafer can have different emission characteristics or color spread. FIG. 1 shows one example of a wavelength emission map 10 for a wafer of blue emitting LEDs showing wavelength variations across the wafer, and each wafer can have its own unique emission map. In the map shown, the wavelength distribution is in the range of approximately 445 to 460 nm, although other wafers can experience different distributions in different wafer areas. This distribution can result from different factors such as variations in the epitaxial material during growth of the LEDs, or from variations in the flatness (i.e. bow) of the growth substrate.

The wafer can be coated with a conversion material (i.e. phosphor) using one of the methods described above, and FIG. 2 shows a conversion material thickness map 20 following coating. In some fabrication processes the coating can be planarized using known methods. The thickness of the coating can vary across the wafer due to different factors such as variations in the thickness of the underlying wafer and in planarizing variations. In the embodiment shown the wafer experiences a total thickness variation of approximately 3 µm. The wavelength emission variations of the LEDs and thickness variations of the conversion material across the wafer can result in a spread of emission wavelengths or color points of the LED chips singulated from the wafer. This spread can exacerbate by phosphor loading variations or concentrations across the wafer.

The human eye is relatively sensitive to variations in emission wavelengths and can detect relatively small differences in emission wavelengths or color. Perceptible variations in color emitted by packages designed to emit a single color of light can reduce customer satisfaction and reduce overall acceptance of LED packages for commercial uses. In an effort to provide LEDs that emit light of the same or similar wavelength, the LEDs can be tested and sorted by color or brightness. This process is generally known in the art as binning. Each bin typically contains LEDs from one color and brightness group and is typically identified by a bin code. White emitting LEDs can be sorted by chromaticity (color) and luminous flux (brightness). Color LEDs can be sorted by dominant wavelength, and luminous flux, or in the case of certain colors such as royal blue, by radiant flux. LEDs can be shipped, such as on reels, containing LEDs from one bin and are labeled with the appropriate bin code.

FIG. 3 shows one example of a chromaticity region map 30 plotted on the 1931 CIE Curve, with each of these regions corresponding to a particular chromaticity of white LEDs. The regions are shown surrounding the black body curve or black body locus (BBL) and each of these regions is designed to designate chromaticity variations that are within acceptable ranges to the human eye. For example, region WF designates a particular region having substantially imperceptible chromaticity variations such that LEDs emitting within this region would be binned together.

FIG. 4 shows one example of the distribution of emission characteristics for a sample batch of wafers with blue emitting LEDs, following coating with a conversion material. The region designations correspond to different chromaticity regions for a map, such as the one in FIG. 3. The majority of the coated LEDs emit in regions WC, WD, WG and WH, with the remaining LEDs emitting in other regions, some being outside the map regions. This variation in emission characteristics results from emission wavelength variations across the LED wafer and phosphor thickness variations, and the emission variations would require multiple different bins for the individual LEDs.

This binning process typically increases the manufacturing cost of LEDs by the overhead associated with the testing and separation of devices with different emission characteristics, and the formulation of the data and records surrounding this process. The greater the number of bins for a particular LED being manufactured, the greater the additional cost associated with the binning process. This in turn can result in increased end cost for the LEDs. This binning process could be reduced if coated LEDs across the wafer emitted light closer to a target color point.

One method for measuring the target emission for LEDs is by standard deviation from a target color point, with one example being deviation by MacAdam Ellipses on the CIE color region map as shown in FIG. 3. These ellipses are generally known in the art and are defined to establish the boundaries of how far colors of light can deviate from the target before a difference in the target light is perceived. MacAdam ellipses are described as having "steps" or "standard deviations". For example, any point on the boundary of a "1-step" ellipse drawn around the target represents one standard deviation from the target. Specified tolerances for conventional lamps (incandescent or fluorescent) are within a 4-step MacAdam ellipse. For LEDs to become more generally accepted by consumers for general lighting applications, they should be provided with emission characteristics within accepted specified tolerances, such as the 4-step MacAdam ellipse. For some current manufacturing processes, the yield within a 4-step MacAdam ellipse can be 20% or lower.

SUMMARY OF THE INVENTION

The present invention discloses new methods for fabricating semiconductor devices such as LED chips at the wafer level, and discloses LED chips and LED chip wafers fabricated using the methods. The present invention is directed to controlling the emission characteristics of LED chips by altering the amount of LED light that is converted by the LED chip's conversion material. On way of altering the amount of light that is converted is by reducing the amount of conversion material over the LEDs. The methods according to the present invention are particularly applicable to altering the conversion material over LED chips at the wafer level to provide a high yield of LED chips emitting approximately at a target emission characteristic or within a range of emission characteristics, such as a chromaticity region on a CIE Curve. The present invention can also be utilized for fabricating LED chips at a wafer level with having a high yield of emissions within a stand deviation by MacAdam ellipses, such as a 4-step MacAdam ellipse.

One embodiment of a method according to the present invention for fabricating light emitting diode (LED) chips comprises providing a plurality of LEDs and coating the LEDs with a conversion material so that at least some light from the LEDs passes through the conversion material and is converted. The light emission from the LED chips comprises conversion material converted light. The emission characteristics of at least some of the LED chips are measured, and at least some of the conversion material over at least some of the LEDs is removed to alter the emission characteristics of the LED chips.

One embodiment of an LED chip wafer according to the present invention comprises a plurality of LEDs on a wafer and a conversion material at least partially covering the LEDs. At least some light from the LEDs passes through the conversion material and is converted. The conversion material over at least some of the LEDs is micro-machined so that at least some of the LED chips emits light having emission characteristics substantially within a range of target emission characteristics.

One embodiment of an LED chip according to the present invention comprises an LED and a phosphor coating at least partially covering the LED so that at least some of the light emitted by the LED is converted by the phosphor. The coating is machined so that the LED chip emits light having characteristics within a range of target emission characteristics.

One embodiment of an LED package according to the present invention comprises an LED chip having an LED and a coating at least partially covering the LED. The coating is micro-machined so that the LED chip emits light within a deviation from a target emission. The package further comprises package leads in electrical connection with the LED and encapsulation surrounding the LED chip and electrical connections.

These and other aspects and advantages of the invention will become apparent from the following detailed description and the accompanying drawings which illustrate by way of example the features of the invention.

BRIEF DESCRIPTION OF THE DRAWINGS

FIG. 9 is a flow diagram for another embodiment of a method for fabricating LED chips according to the present invention;

FIG. 11 is a flow diagram for still another embodiment of a method for fabricating LED chips according to the present invention;

FIG. 12 is a plan view of an LED wafer micro-machined pursuant to one method according to the present invention;

DETAILED DESCRIPTION OF THE INVENTION

Figure 1:
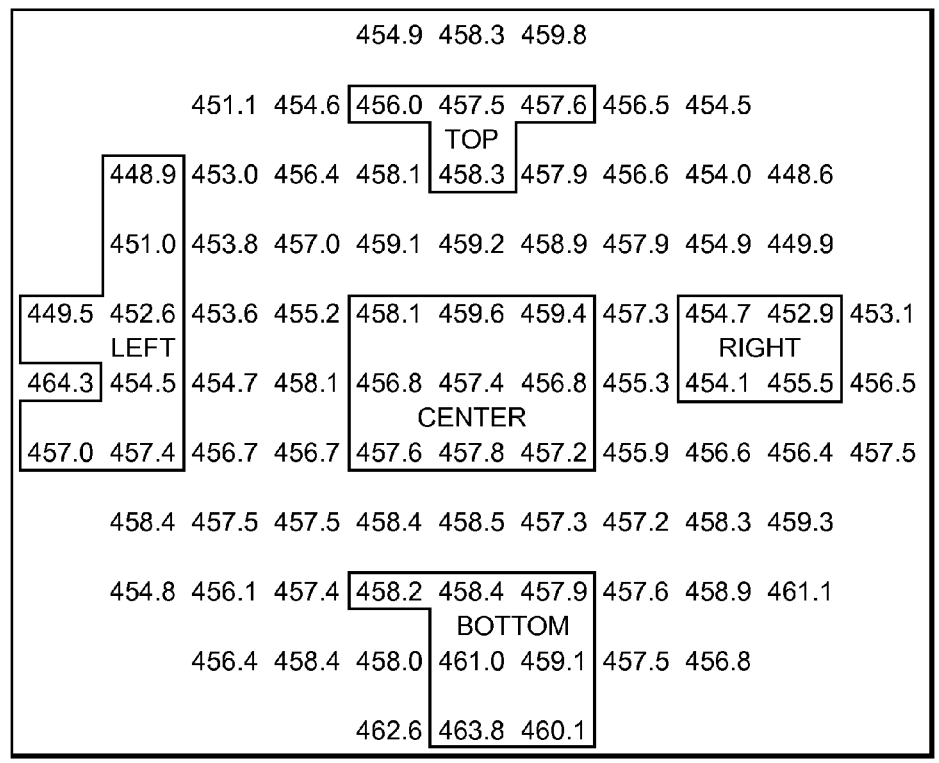
FIG. 1 shows one embodiment of a wavelength emission map across an LED wafer having blue emitting LEDs.
Figure 2:
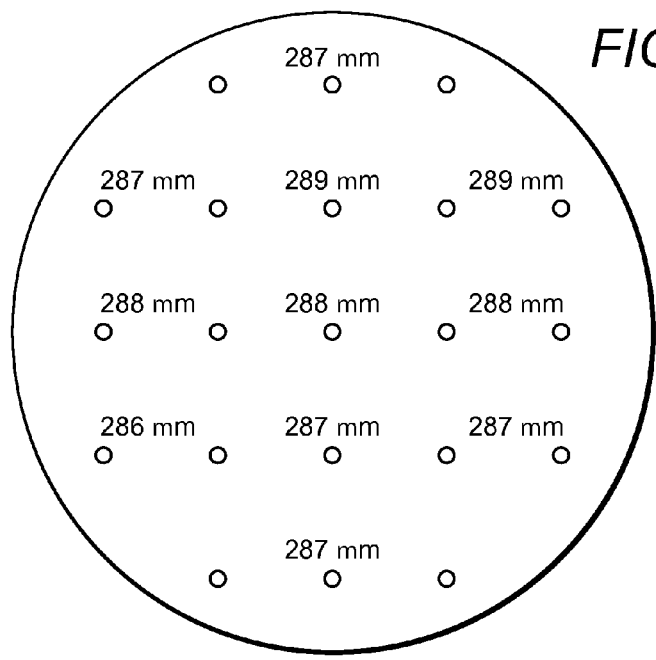
FIG. 2 shows one embodiment of a conversion material thickness map across an LED wafer.
Figure 3:
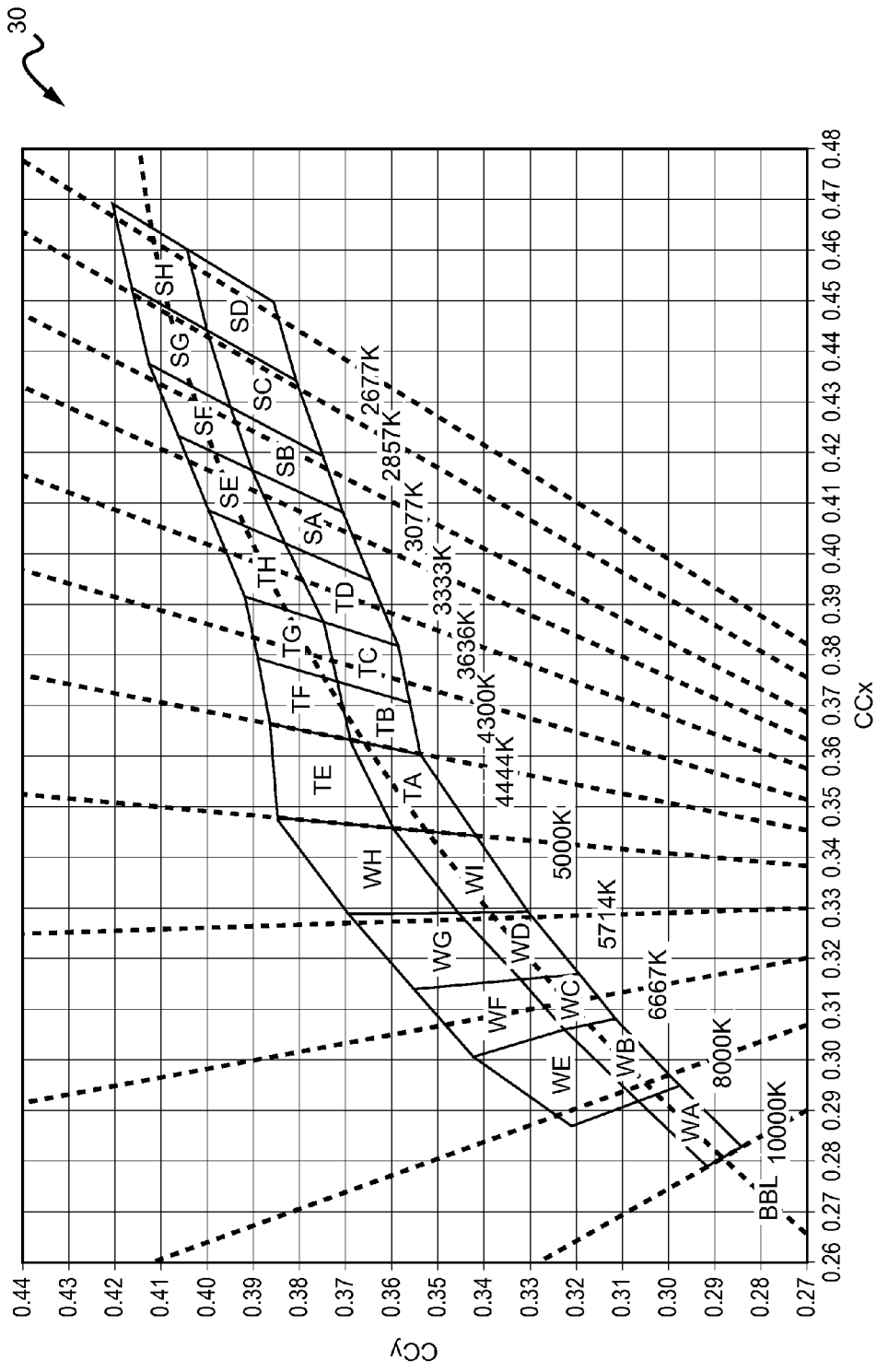
FIG. 3 shows one embodiment of a chromacity region map plotted on a 1931 CIE curve.
Figure 4:
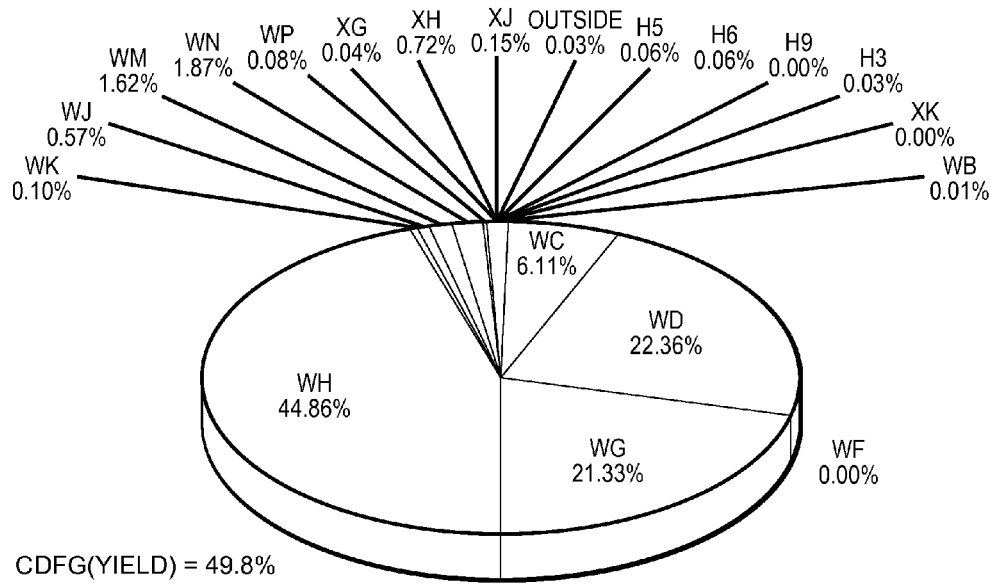
FIG. 4 is a graph showing distribution of emission characteristics for LEDs on a LED wafer prior to conversion material machining.

The present invention is directed to methods for tuning the emission characteristics of solid state emitters by altering the amount of conversion material over emitters, and is also directed to emitters fabricated using the methods. The present invention provides fabrication methods that are particularly applicable to wafer level fabrication of LEDs and altering the conversion material at the wafer level to reduce or eliminate the variations in emission characteristics of LED chips across the wafer. The methods according to the present invention can also be used to alter the emission characteristics of individual LEDs or groups of LEDs singulated from a wafer.

The present invention can be used to fabricate different LED chips but is particularly applicable to fabricating white emitting LED chips. In one such embodiment, a wafer of blue emitting LEDs having a dominant emission wavelength for example of between approximately 440 to 480 nm can be coated with a conversion material, such as cerium doped YAG phosphor. As mentioned above, the resulting LED chips across the wafer can experience emission variations or shifts arising from LED wavelength emission variations and phosphor thickness variations. This color variation, and resulting binning requirements, can be reduced or eliminated by selectively machining or micro-machining the phosphor layer over the particular LEDs across the wafer.

As described below, many different machining methods can be used. For those wafers where the LED wavelength emissions can be segregated to regions of multiple LEDs having the same or similar emission wavelengths, the phosphor can be selectively macro-machined over the regions to achieve reduced binning or single binning, such as to a chromaticity region on a CIE Curve, or within a standard deviation by MacAdam ellipses. The phosphor can then be micro-machined over the individual LEDs to further tune their emission characteristics to within the chromaticity region or standard deviation. In other embodiments, the phosphor over the individual LEDs can be micro-machined without first macro-machining over wafer regions. One micro-machining process that can be used according to the present invention comprises micro-drilling of holes in the conversion material over the LEDs, with the depth of the holes being controlled with a resolution of a micrometer or less. In still other embodiments prearranged areas or regions of the LED can be designated and machined based on the optimum amount of conversion material to be removed within the region to achieve reduced binning. These prearranged regions can include rows, columns or diagonal lines of LEDs, or shapes such as circles or ovals.

The present invention is described herein with reference to certain embodiments but it is understood that the invention can be embodied in many different forms and should not be construed as limited to the embodiments set forth herein. In particular, the present invention is described below in regards to coating LEDs with a down-converter coating that typically comprises a phosphor loaded binder ("phosphor/binder coating"), but it is understood that the present invention can be used to coat LEDs with other materials for down-conversion, protection, light extraction or scattering. It is also understood that the phosphor binder can have scattering or light extraction particles or materials, and that the coating can be electrically active. The methods according to the present invention can also be used for coating other semiconductor devices with different materials. Additionally, single or multiple coatings and/or layers can be formed on the LEDs. A coating can include no phosphors, one or more phosphors, scattering particles and/or other materials. A coating may also comprise a material such as an organic dye that provides down-conversion. With multiple coatings and/or layers, each one can include different phosphors, different scattering particles, different optical properties, such as transparency, index of refraction, and/or different physical properties, as compared to other layers and/or coatings.

It is also understood that when an element such as a layer, region or substrate is referred to as being "on" another element, it can be directly on the other element or intervening elements may also be present. Furthermore, relative terms such as "inner", "outer", "upper", "above", "lower", "beneath", and "below", and similar terms, may be used herein to describe a relationship of one layer or another region. It is understood that these terms are intended to encompass different orientations of the device in addition to the orientation depicted in the figures.

Although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Embodiments of the invention are described herein with reference to cross-sectional view illustrations that are schematic illustrations of embodiments of the invention. As such, the actual thickness of the layers can be different, and variations from the shapes of the illustrations as a result, for example, of manufacturing techniques and/or tolerances are expected. Embodiments of the invention should not be construed as limited to the particular shapes of the regions illustrated herein but are to include deviations in shapes that result, for example, from manufacturing. A region illustrated or described as square or rectangular will typically have rounded or curved features due to normal manufacturing tolerances. Thus, the regions illustrated in the figures are schematic in nature and their shapes are not intended to illustrate the precise shape of a region of a device and are not intended to limit the scope of the invention. Embodiments of the invention are also described herein with reference to certain layers, regions or features. It is also understood that other embodiments according to the present invention can have additional or fewer layers, regions and features, and that the layer, regions and features can be arranged in different ways.

Figure 5:
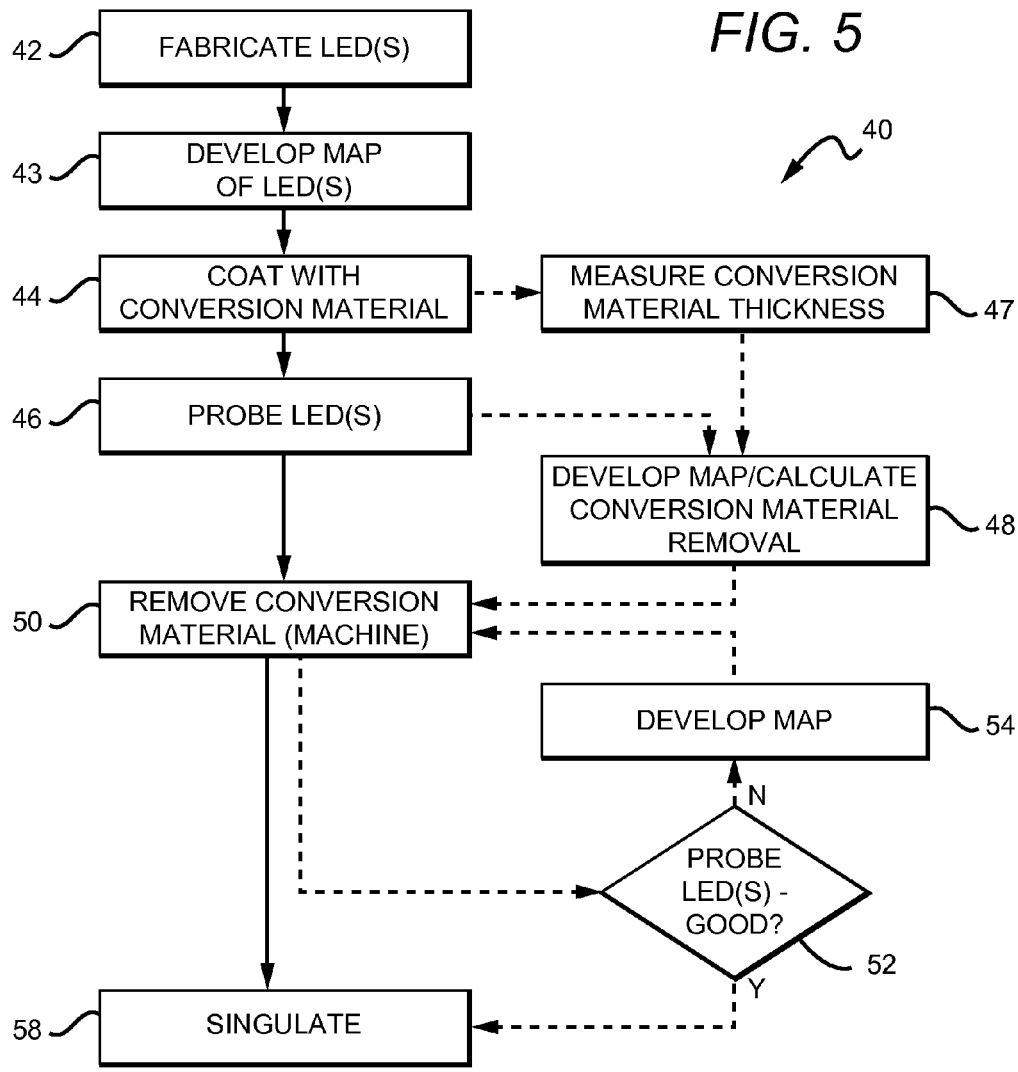
FIG. 5 is a flow diagram for one embodiment of a method for fabricating LED chips according to the present invention.

FIG. 5 shows one embodiment of method 40 according to the present invention for fabricating LEDs, and although steps are being shown in a particular order it is understood that the steps can occur in a different order and different steps can be used. The present method is described with reference to the fabrication of LEDs, but it is understood that it can be used to fabricate other solid state emitters and other semiconductor devices.

In 42 LEDs are fabricated on a growth wafer or substrate, and the LEDs can have many different semiconductor layers arranged in different ways. The fabrication and operation of LEDs is generally known in the art and only briefly discussed herein. The layers of the LEDs can be fabricated using known processes with a suitable process being fabrication using metal organic chemical vapor deposition (MOCVD). The layers of the LEDs generally comprise an active layer/region sandwiched between first and second oppositely doped epitaxial layers, all of which are formed successively on the growth wafer or substrate ("wafer"). The LED layers can initially be formed as continuous layers across the substrate with the layers then partitioned or separated into individual LEDs. This separation can be achieved by having portions of the active region and doped layers etched down to the wafer to form the open areas between the LEDs. In other embodiments the active layer and doped layers can remain continuous layers on the wafer and can be separated into individual devices when the LED chips are singulated.

It is understood that additional layers and elements can also be included in each of the LEDs, including but not limited to buffer, nucleation, cap, contact and current spreading layers as well as light extraction layers and elements. The active region can comprise single quantum well (SQW), multiple quantum well (MQW), double heterostructure or super lattice structures, and as is understood in the art, the oppositely doped layers are commonly referred to as n-type and p-type doped layers.

The LEDs may be fabricated from different material systems, with preferred material systems being Group-III nitride based material systems. Group-III nitrides refer to those semiconductor compounds formed between nitrogen and the elements in the Group III of the periodic table, usually aluminum (Al), gallium (Ga), and indium (In). The term also refers to ternary and quaternary compounds such as aluminum gallium nitride (AlGaN) and aluminum indium gallium nitride (AlInGaN). In a preferred embodiment, the n- and p-type layers are gallium nitride (GaN) and the active region is InGaN. In alternative embodiments the n- and p-type layers may be AlGaN, aluminum gallium arsenide (AlGaAs) or aluminum gallium indium arsenide phosphide (AlGaInAsP).

The wafer can be made of many materials such as silicon, sapphire, silicon carbide, aluminum nitride (AlN), GaN, with a suitable wafer being a 4H polytype of silicon carbide, although other silicon carbide polytypes can also be used including 3C, 6H and 15R polytypes. Silicon carbide has certain advantages, such as a closer crystal lattice match to Group III nitrides than sapphire and results in Group III nitride films of higher quality. Silicon carbide also has a very high thermal conductivity so that the total output power of Group-III nitride devices on silicon carbide is not limited by the thermal dissipation of the wafer (as may be the case with some devices formed on sapphire). SiC wafers are available from Cree Research, Inc., of Durham, N.C. and methods for producing them are set forth in the scientific literature as well as in a U.S. Pat. Nos. Re. 34,861; 4,946,547; and 5,200,022.

Each of the LEDs can also have first and second contacts. The LEDs can have vertical geometry with a first contact on the substrate and a second contact on the LEDs top layer, which is typically a p-type layer. The first and second contacts can comprise many different materials such as Au, copper (Cu) nickel (Ni), indium (In), aluminum (Al) silver (Ag), or combinations thereof. In still other embodiments the contacts can comprise conducting oxides and transparent conducting oxides such as indium tin oxide, nickel oxide, zinc oxide, cadmium tin oxide, titanium tungsten nickel, indium oxide, tin oxide, magnesium oxide, $ZnGa_2O_4$, $ZnO_2/Sb$, $Ga_2O_3/Sn$, $AgInO_2/Sn$, $In_2O_3/Zn$, $CuAlO_2$, $LaCuOS$, $CuGaO_2$ and $SrCu_2O_2$. The choice of material used can depend on the location of the contacts as well as the desired electrical characteristics such as transparency, junction resistivity and sheet resistance. In the case of Group-III nitride devices, it is known that a thin semitransparent current spreading layer typically can cover some or the entire p-type layer. It is understood that the second contact can include such a layer which is typically a metal such as platinum (Pt) or a transparent conductive oxide such as indium tin oxide (ITO), although other materials can also be used. The present invention can also be used with LEDs having lateral geometry wherein both contacts are on the top of the LEDs. The LEDs can also comprise additional current spreading structures or grids.

In one embodiment, each of the LEDs can further comprise one or more pedestals each of which is provided to allow electrical contact to a respective one of the LED's contacts after phosphor coating of the LEDs. This embodiment is described in more detail below and in white chip patent applications U.S. patent application Ser. No. 11/656,759, and U.S. patent application Ser. No. 11/899,790, both entitled "Wafer Level Phosphor Coating Method and Devices Fabricated Utilizing Method", and both incorporated by reference as though fully set forth herein.

Following LED wafer level fabrication, in 43 the LEDs can be probed at the wafer level to measure device characteristics such as operating voltage, leakage current, peak and dominant emission blue wavelength, blue light intensity. Different probing methods can be used and in one embodiment an electrical signal is applied to each of LEDS causing them to emit light, and the output emission characteristics are measured. In different probing steps, the entire wafer can be activated and the output of LEDs measured, LEDs within different regions or groups can be activated and its output measured, or each LED can be individually activated and its output measured. This probing process can also identify defective LEDs that will not be further processed, thereby reducing the overall processing time and expense for the wafer.

The wafer can also be visually inspected for visible defects to identify LEDs with physical defects from fabrication that would result in the LEDs not functioning properly. A map of the defective LEDs can be generated with the defective LEDs being excluded from further probing and micro-machining processes. By excluding the defective LEDs, the time and expense associated with processing the LED wafer can be reduced.

Based on the visual and electrical/optical inspection a known good die map of the wafer is generated for wafer level white chip fabrication. The map can also indicate the emission wavelength for the LEDs across the wafer. For example, a wafer of blue emitting LEDs can experience emission wavelength variations of approximately 450 to 460 nm. It is understood that other embodiments of methods according to the present invention can be completed without generating a wafer level LED visual and or emission characteristic map as described in 43. It is also understood that different embodiments according to the present invention can use different methods or processes to develop die maps, and the maps can show different emitter characteristics.

In 44, the wafer is coated by a phosphor/binder coating that covers each of the LEDs. The phosphor/binder coating can be applied using different known processes such as dispensing, electrophoretic deposition, electrostatic deposition, printing, jet printing or screen printing, although many other deposition methods and combinations of methods can be used. In other embodiments the coating can be provided as a separately fabricated preform that can be bonded or mounted over the LEDs.

In one embodiment, the phosphor can be deposited over the wafer in a phosphor/binder mixture using spin coating. Spin coating is generally known in the art and generally comprises depositing the desired amount of binder and phosphor mixture at the center of the substrate and spinning the substrate at high speed. The centrifugal acceleration causes the mixture to spread to and eventually off the edge of the substrate. Final layer thickness and other properties depend on the nature of the mixture (viscosity, drying rate, percent phosphor, surface tension, etc.) and the parameters chosen for the spin process. For large wafers it may be useful to dispense the phosphor/binder mixture over the substrate before spinning the substrate at high speed.

In other embodiments, the phosphor is deposited on the wafer using known electrophoretic deposition methods. The wafer and its LEDs are exposed to a solution containing phosphor particles suspended in a liquid. An electrical signal is applied between the solution and the LEDs which creates an electrical field that causes the phosphor particles to migrate to and deposit on the LEDs. The process typically leaves the phosphor blanketed over the LEDs in powder form. A binder can then be deposited over the phosphor with the phosphor particles sinking into the binder to form the coating. The binder coating can be applied using many known methods and in one embodiment, the binder coating can be applied using spin coating.

The phosphor/binder coating can then be cured using many different curing methods depending on different factors such as the type of binder used. Different curing methods include but are not limited to heat, ultraviolet (UV), infrared (IR) or air curing. Different materials can be used for the binder, with materials preferably being robust after curing and substantially transparent in the visible wavelength spectrum. Suitable material include silicones, epoxies, glass such as low temperature melting point glass, inorganic glass, spin-on glass, dielectrics, BCB, polymides, polymers and hybrids thereof, with the preferred material being silicone because of its high transparency and reliability in high power LEDs. Suitable phenyl- and methyl-based silicones are commercially available from Dow® Chemical. In other embodiments, the binder material can be textured or can be engineered to be index matched with the features such as the chip (semiconductor material) and growth substrate, which can reduce total internal reflection (TIR) and improve light extraction. Similarly, the surface of the LEDs can be textured to improve light extraction.

The coating preferably contains one or more light conversion materials that absorb light from the LEDs and re-emits the light at a different wavelength, such as down-converting the light to a longer wavelength. Many different conversion materials can be used, with a suitable material being a phosphor. Different factors determine the amount of LED light that will be absorbed by the phosphor in the final LED chips, including but not limited to the size of the phosphor particles, the percentage of phosphor loading, the type of binder material, the efficiency of the match between the type of phosphor and wavelength of emitted light, and the thickness of the phosphor/binding layer. These different factors can be controlled to control the emission wavelength of the LED chips according to the present invention.

Many different phosphors can be used in the coating according to the present invention. The present invention is particularly adapted to LED chips emitting white light. In one embodiment according to the present invention LEDs emit light in the blue wavelength spectrum and the phosphor absorbs some of the blue light and re-emits yellow. The LED chips emit a white light combination of blue and yellow light. In one embodiment the phosphor comprises commercially available YAG:Ce, although a full range of broad yellow spectral emission is possible using conversion particles made of phosphors based on the $(Gd,Y)_3(Al,Ga)_5O_{12}$:Ce system, such as the $Y_3Al_5O_{12}$:Ce (YAG). Other yellow phosphors that can be used for white emitting LED chips include:
$Tb_{3-x}RE_xO_{12}$:Ce(TAG); RE=Y, Gd, La, Lu; or
$Sr_{2-x-y}Ba_xCa_ySiO_4$:Eu.

First and second phosphors can also be combined for higher CRI white of different white hue (warm white) with the yellow phosphors above combined with red phosphors. Different red phosphors can be used including:
$Sr_xCa_{1-x}S$:Eu, Y; Y=halide;
$CaSiAlN_3$:Eu; or
$Sr_{2-y}Ca_ySiO_4$:Eu Other phosphors can be used to create saturated color emission by converting substantially all light to a particular color. For example, the following phosphors can be used to generate green saturated light:
$SrGa_2S_4$:Eu;
$Sr_{2-y}Ba_ySiO_4$:Eu; or
$SrSi_2O_2N_2$:Eu.

The following lists some additional suitable phosphors that can be used as conversion particles, although others can be used. Each exhibits excitation in the blue and/or UV emission spectrum, provides a desirable peak emission, has efficient light conversion, and has acceptable Stokes shift:
YELLOW/GREEN
$(Sr,Ca,Ba) (Al,Ga)_2S_4$:Eu$^{2+}$
$Ba_2 (Mg, Zn) Si_2O_7$:Eu$^{2+}$
$Gd_{0.46}Sr_{0.31}Al_{1.23}O_xF_{1.38}$:Eu$^{2+}{}_{0.06}$
$(Ba_{1-x-y}Sr_xCa_y) SiO_4$:Eu
$Ba_2SiO_4$:Eu$^{2+}$
RED
$Lu_2O_3$:Eu$^{3+}$
$(Sr_{2-x}La_x) (Ce_{1-x}Eu_x) O_4$
$Sr_2Ce_{1-x}Eu_xO_4$
$Sr_{2-x}Eu_xCeO_4$
$SrTiO_3$:Pr$^{3+}$,Ga$^{3+}$
$CaAlSiN_3$:Eu$^{2+}$
$Sr_2Si_5N_8$:Eu$^{2+}$ Different sized phosphor particles can be used including but not limited to 10-100 nanometer (nm)-sized particles to 20-30 µm sized particles, or larger. Smaller particle sizes typically scatter and mix colors better than larger sized particles to provide a more uniform light. Larger particles are typically more efficient at converting light compared to smaller particles, but emit a less uniform light. In one embodiment, the particle sizes are in the range of 2-5 µm. In other embodiments, the coating can comprise different types of phosphors or can comprise multiple phosphor coatings for monochromatic or polychromatic light sources.

The coating can also have different concentrations or loading of phosphor materials in the binder, with a typical concentration being in range of 30-70% by weight.

In one embodiment, the phosphor concentration is approximately 65% by weight, and is preferably uniformly dispersed throughout the binder. Still in other embodiments the coating can comprise multiple layers of different concentrations or types of phosphors, and the multiple layers can comprise different binder materials. In other embodiments, one or more of the layers can be provided without phosphors, with one or more being substantially transparent to the LED light. In some embodiments one or more of these transparent layers can serve as a spacer layer.

After the initial coating of the LEDs, further processing may be needed such as planarization of the phosphor/binder coating to expose structure below (such as pedestals) or to reduce the overall thickness of the coating. Many different thinning processes can be used including known mechanical processes such as grinding, lapping or polishing, preferably after the binder has cured. Other fabrication methods can comprise a squeegee to thin the coating before cured or pressure planarization can also be used before the coating is cured. Still in other embodiments the coating can be thinned using physical or chemical etching, or ablation. The coating can have many different thicknesses following planarization, with a range of thicknesses in one embodiment being 1 to 100 µm. In still another embodiment, the suitable range of thicknesses is 30 to 50 µm.

In 46 the wafer can again be probed using known processes to measure the output lighting characteristics of the LED chips across the wafer as described above. In alternative step 47, the thickness of the phosphor/binder coating on the semiconductor layers can be calculated such that the output lighting characteristics can be calculated based on the inherent phosphor thickness variations. Using step 47, the concentration of the phosphor particles in the phosphor layer should be known and the concentration should be as uniform as possible across the wafer. The thickness of the phosphor/binder coating can be measured in many different ways using different measuring systems, with one embodiment measuring the thickness of the wafer before and after phosphor/binder coating.

Figure 6:
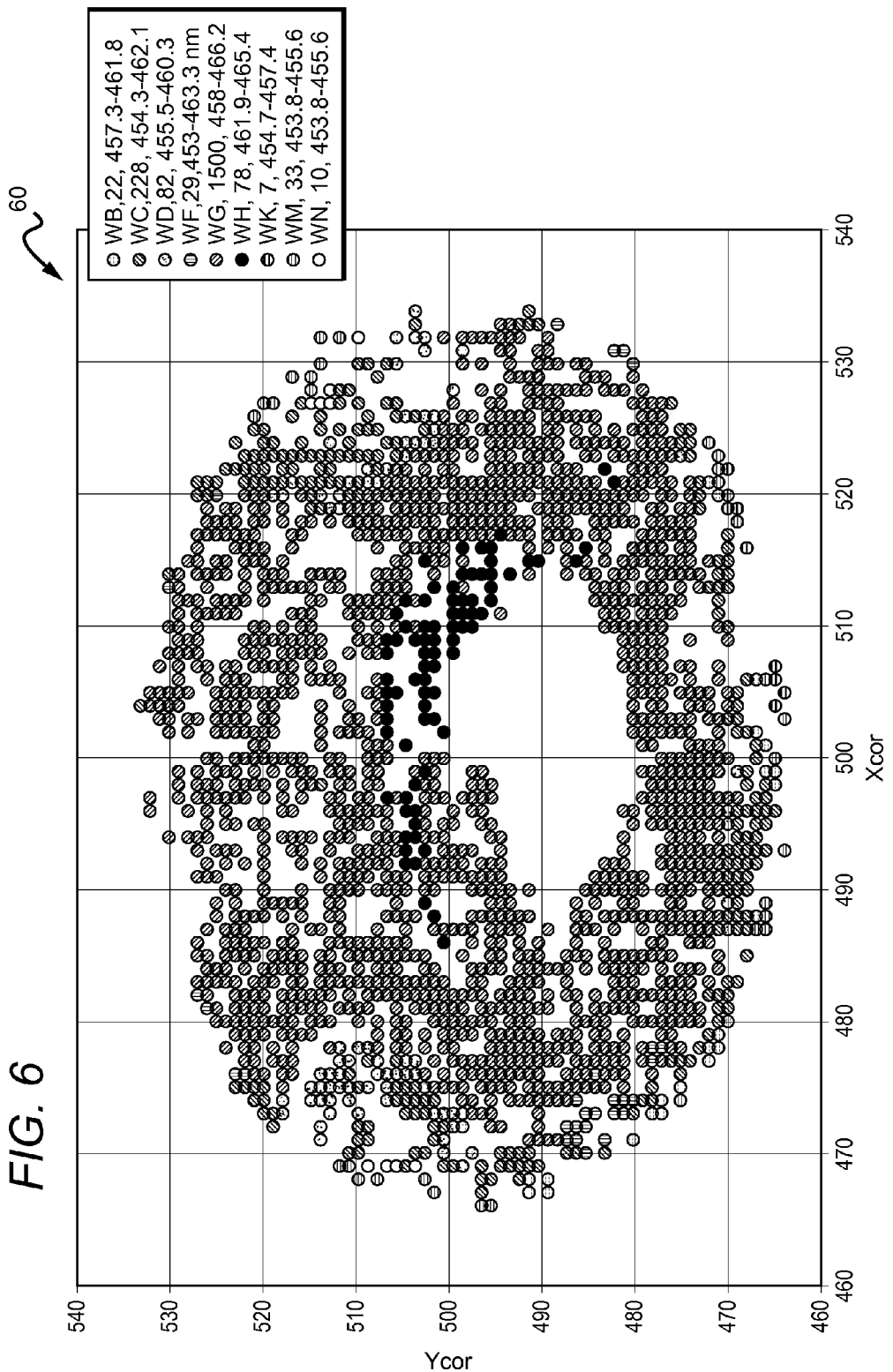
FIG. 6 is one embodiment of a map of the emission characteristics of coated LED chips at the wafer level.

In 48 a map of the output of the LEDs may be developed based on the output characteristics of the probed LEDs or regions of LEDs, or the thickness measurements of the phosphor/binder coating. The map can then be used to determine the amount of conversion material that needs to be removed over each of the LEDs chips or areas of LED chips as described below. FIG. 1 shows one embodiment of a map 10 showing the output characteristics of LEDs across the wafer before coating with a conversion material. FIG. 6 shows more detailed map 60 of the emission characteristics of coated LEDs chips at the wafer level, illustrating that a typical wafer has coated LEDs emitting in various Cree designated chromaticity regions or color bins and outside a standard deviation such as a 4-step MacAdam ellipse. This spread can be due to different factors, such as, LED wavelength emission variations across the wafer, phosphor thickness variation, wafer bow or warping or other process related effects, and variation in phosphor loading/concentration across the wafer.

To more effectively compete with existing conventional lighting technologies, white LED technology should have color point stability and reproducibility within selected bins or within a 4-step MacAdam ellipse as discussed above. To achieve a tighter color point spread across the wafer, the phosphor material is removed selectively based on the LED device emission characteristics, some of which can include color, emission intensity, color temperature, emission shape or field emission patterns.

In 50 the conversion material can be removed over the LEDs based on the removal calculations from step 48. Many different removal methods can be used with one embodiment using machining to remove conversion material over individual, groups or regions of LEDs on the wafer, to reduce the amount of conversion material and thereby modify the emission wavelength of the LEDs. That is, by reducing the amount of conversion material, the light from the LEDs in the particular LED chips passes through a smaller amount of conversion material, and less of the LED light is converted. This results in the overall emission characteristics varying in relation to the amount of conversion material removed. This machining allows for the conversion material to be tuned based on the output characteristics of each of the LEDs across the wafer.

In regards to the present invention, machining can be broadly categorized in two types; micro-machining and macro-machining. Phosphor removal over areas or regions of LEDs is referred to as macro-machining, while phosphor removal over individual LEDs is termed micro-machining. Different grinding/milling zigs, bits can be used to achieve macro-machining and micro-machining. For example, based on the results of probing, and the related output map, there may be individual LEDs or regions of LEDs where it is desirable to remove phosphor material to tune the output of the LEDs to a particular color point. In other areas the output characteristics may be acceptable. Phosphor tuning or removal at the micro- or macro-machining level should be conducted in a controlled fashion both in vertical and lateral direction.

In different methods according to the present invention, wafer probing and map development can be included for completing a first level macro-machining step. In these methods, the wafer can be probed and based on the probe data, the wafer can be divided into zones or regions having LEDs with similar device characteristics. These regions can undergo a macro-machining to bring the region closer to the target emission characteristic. The wafer can be probed again with the individual LEDs being micro-machined to emit at or near the target emission characteristics. By providing macro (or region) based micro-machining as an initial step, machining processes can initially be used that typically cover larger areas and do not have fine depth control. These larger area processes can be faster and more cost effective and can result in the level of micro-machining required at the individual LED level to be minimized or reduced. This can make the overall micro-machining process more efficient.

In the fabrication of white LEDs for example, the wafer division can be based on the emission characteristics of the blue emitting LEDs prior to coating. The wafer division can then be based on the white point data following coating of the wafer. A map can be generated using both the blue emitting and coated characteristics of the LEDs showing the regions for macro level micro-machining.

Figure 7:
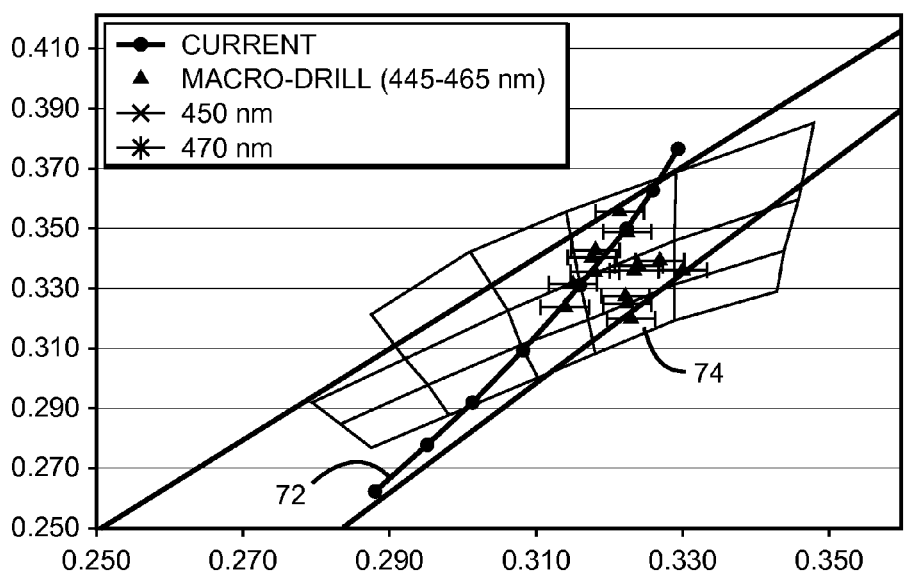
FIG. 7 shows a chromaticity region map with points showing emission characteristics of LEDs following machining at a regional level.

FIG. 7 shows a CIE graph 70 with regions corresponding to a particular chromaticity of LEDs with line 72 approximates the distribution of color points from a wafer of LEDs prior to macro micro-machining of the conversion material. The emissions from the LEDs spread across several chromaticity regions, with some of the LEDs emitting outside of the regions. Points 74 show examples of emission characteristics of the same LEDs on the wafer following removal of some of the conversion material in emission regions, and in this embodiment the conversion material is removed from regions on the wafer having LEDs emitting within a 2.5 nm DOM wavelength. For example, the phosphor material can be removed from the region on the wafer where the emission wavelengths of the LEDs vary from 450 nm to 452.5 nm. This region removal corresponds to the macro level of conversion material removal, and as is shown by points 74, the emission characteristics of the LEDs are now grouped around 4-5 adjacent regions on the CIE graph. The emission characteristics of the LEDs are more closely arranged around a single bin or single deviation pattern.

Figure 8:
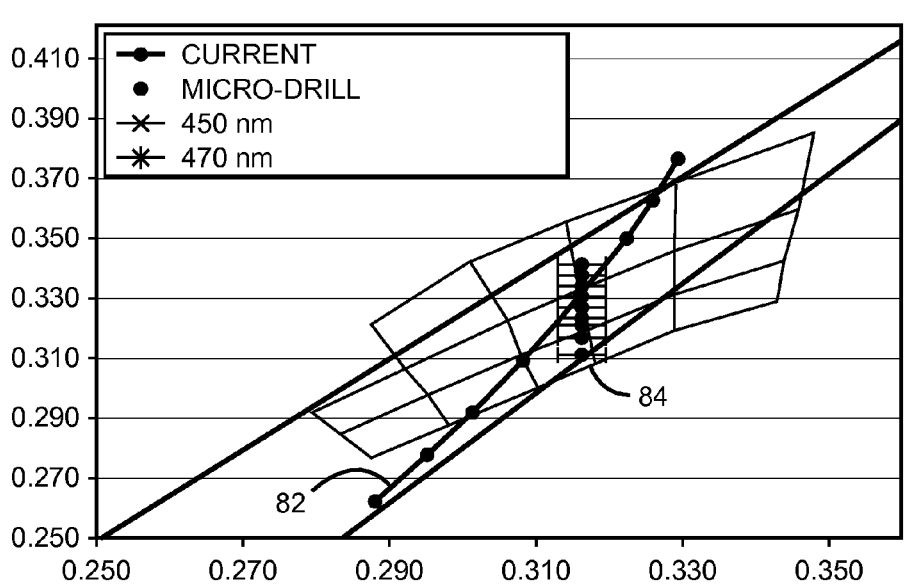
FIG. 8 shows a chromaticity region map with points showing emission characteristics of LEDs following micro-machining.

FIG. 8 shows another CIE graph 80 again showing a line 82 that approximates the distribution of color points from a wafer of LEDs prior to machining of the conversion material. Points 84 show emission points for the same LEDs following machining of regions having a 2.5 nm DOM wavelength and following micro-machining using one of the methods described below. In this embodiment, the phosphor is micro-machined for every 1 nm DOM wavelength, and results the emission characteristics of the LEDs being more tightly clustered around a target emission characteristic. This allows for many of the LEDs to be within a target emission region (or bin), or within a target emission deviation (MacAdam ellipse).

Phosphor removing can be accomplished using several known techniques such as chemical, physical, mechanical etching and photo-ablation. There are several known techniques to chemically etch various phosphors and/or binding materials (resins, silicones, glass etc). Chemical etching of phosphor coating can be based on the type of the phosphor and the binding layer. Different etch chemistries have different etch selectivity between the phosphor and the binder layer and the etchant selected should be inert to the underlying LED structure. Also, in applications where selective area phosphor removal is desired, a temporary mask layer/technology may be required. This can add additional steps and may not be a cost effective solution. Examples of physical etching include sputtering of the phosphor layer by high energy species. These could be plasma etching, physical sputtering using abrasive media such as polycarbonates, alumina, dry ice, etc. A selective area sandblasting or gas ($CO_2$) blasting can also be used where a nozzle crystallizes the gas as it exits, with the crystals used as the blasting compound. In each of these blasting embodiments, a mask can be used to protect the areas where the phosphor/binder layer thickness is not to be reduced by the sand or gas crystal blasting. Requiring a masking layer can increase the process steps and cost of physical etching techniques. Abrasive media should also be completely removed from the devices, which can require expensive vacuum removing techniques. Still other machining processes can comprise jetting or ultra-sonic machining.

Another method that can be used according to the present invention is mechanical etching such as grinding, milling, and drilling. This process can be less complicated and less costly than other processes and can utilize grinding and drilling bits of appropriate size, shape based on the machining application. Phosphor layer over large area (such as a few millimeters), intermediate area (1-5 mm) and small area (less than 1 mm) can be removed in a single step on a CNC machine tool.

In other embodiments, the phosphor/binder layer can be removed by machining through laser ablation, which is a known process of removing material by irradiating it with a laser beam. Using a low laser flux, the material can be heated by the absorbed laser energy and evaporates or sublimates. At high laser flux, the material can be typically converted to a plasma. Laser ablation typically removes material with a pulsed laser, but it is possible to ablate material with a continuous wave laser beam if the laser intensity is high enough. Laser removal techniques typically leave behind materials and residues, or can char the surface of the conversion material. This process can require an additional cleaning step, such as cleaning using and aqueous etch, to remove the materials or residues.

In still other embodiments, the phosphor/binder layer material can be removed by micro-machining using micro-drilling. This typically comprises using a mechanical drill to form holes in the phosphor/binder layer over the LEDs. Like laser ablation the number, depth and spacing of the holes is determined by the target emission characteristics of the LED and the amount of phosphor/binder material to be removed.

In one embodiment, the depth of the holes in micro-drilling at the micro-machining level should be controlled to the micron or sub-micron level to adequately control the amount of phosphor material removed with each hole. This allows for adequate control of the emission characteristics between different LEDs in the wafer. In one embodiment, a nano-stage can be used to provide this sub-micron level of control. Nano-stages can move in very small increments, and in this embodiment the nano-stage holds the wafer and moves the wafer up in the z-plane in relation to the mechanical drill instead of the drill moving in the z-plane toward the wafer. Typical nano-stages utilize high resolution ball screw and nut mechanisms or piezoelectric actuator mechanisms to achieve sub-micron movement, with some nano-stages providing minimum and incremental motion control to 1 μm or less. In some embodiments, the mechanical drill can be stationary with the nano-stage moving the wafer during drilling. In other embodiments, both the mechanical drill and the nano-stage can move. Many different nano-stages can be used such as the commercially available M-501 Precision Vertical Micropositioning Z-Stage, provided by PI.

In these embodiments, the conversion material can be removed in one hole, while in other embodiments the material can be removed in a series of holes formed in the phosphor/binder layer over the LED. The number, depth and spacing of the holes determined by the target emission characteristics of the LED and the corresponding amount of phosphor/binder layer material to be removed to reach that target. Other etch patterns can be done as well such as grooves, letters, numbers, etc.

In 52 the LEDs can undergo an alternative step of being probed a second time and their output measured to confirm that the LEDs now emit at the target emission characteristics or within an acceptable deviation from the target emission. If the emission of some of the LEDs is not acceptable, they can again be micro-machined at 50 to remove additional phosphor/binder layer material. As part of this second probing and prior to more micro-machining, in 54 a second map of the LED output characteristics can be generated and used to determine the amount of phosphor/binder layer material to be removed through additional micro-machining. Following the second micro-machining, the LEDs can again be probed, and if necessary, additional micro-machining can be performed, with this process continuing until the LEDs emit at or near the target emission.

In 58 the individual LED chips can be singulated from the wafer using known methods such as dicing, scribe and breaking, or etching. This can occur directly from the micromachining 50 or after the second probing 52 if the emission of the LEDs is acceptable and no further micro-machining is needed. The singulating process separates each of the LED chips with each having substantially the same emission characteristics. This allows for reliable and consistent fabrication of LED chips having similar emission characteristics. Following singulating the LED chips can be mounted in a package, or to a submount or printed circuit board (PCB) without the need for further processing to add phosphor. In one embodiment the package/submount/PCB can have conventional package leads with the pedestals electrically connected to the leads. A conventional encapsulation can then surround the LED chip and electrical connections. In another embodiment, the LED chip can be enclosed by a hermetically sealed cover with an inert atmosphere surrounding the LED chip at or below atmospheric pressure.

FIG. 9 shows one embodiment of method 90 according to the present invention for fabricating LEDs, and although the steps are being shown in a particular order it is understood that the steps can occur in a different order and different steps can be used. The method 90 is described with reference to the fabrication of LEDs, but it is understood that it can be used to fabricate other solid state emitters and other semiconductor devices.

Some of the steps in method 90 are similar to those in method 50 described above and shown in FIG. 5, and for the similar steps the same reference numbers will be used with the understanding that the description of these steps from above applies to this embodiment. In 42 LEDs are fabricated on a growth wafer or substrate ("wafer"), and in 43 the LEDs can be probed at the wafer level to measure device characteristics. In 44 the wafer is coated by a phosphor/binder coating that covers each of the LEDs. In 46 the wafer can again be probed to measure the output lighting characteristics of the LEDs across the wafer and in 92 a wafer level hole depth map can be developed. This can take the form a map of the layout of the wafer or can be in the form of a database or spreadsheet showing the depth of a hole along with the coordinates for the hole. In one embodiment, the coordinates for the holes can take the form of row and column for the particular LED on the wafer. The hole depth corresponds to the amount of conversion material to be removed over a particular one of the LEDs to change the LED's emission characteristics. In one embodiment, the database provides for only one hole over each of the LEDs, although it is understood that in other embodiments the database can provide for multiple holes formed over each of the LEDs.

In 94, the method 90 includes measuring the variations in the surface of the conversion material and generating a wafer surface (shape) profile. The method 90 compensates for those variations in determining how deep the holes should be over each of the LEDs in light of the variations. Stated differently, the variations in the surface of the conversion material are measured and compensated for in determining how much conversion material should be removed over each of the LEDs. In one embodiment, the variations are measured with respect to a reference point, with "valley" surface variations that go below this reference point being negative values, and peaks that go above the reference point being positive values.

Figure 10:
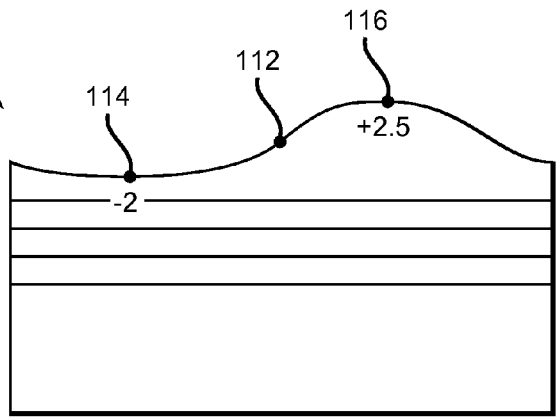
FIG. 10 is a sectional view of an LED wafer showing surface variations.

FIG. 10 shows a LED wafer 110 and illustrates how surface variations are measured. It is understood that the wafer 110 and its surface variations are shown "not-to-scale" to aid in description and understanding. A reference point 112 is selected on the LED wafer with the variations measured in relation to that reference point. The reference point 112 can be in different locations on the surface of the LED wafer 110, with one embodiment having the reference point at or near the center of the wafer 110. In other embodiments it can be in other locations on the LED wafer 110, while in still other embodiments it can be off the LED wafer 110 such as a fixed point on the stage holding the wafer 110. As the surface variations are measured a surface variation map can be generated. A valley point 114 is shown as being a negative value (e.g. −2 microns in this case) in relation to the reference point 112, and peak point 116 is a positive value (+2.5 microns in this case). As further described below, in this embodiment the surface variation is taken into account when determining the final hole depth over each of the LEDs.

Different types of variation measurement methods and devices can be used. In one embodiment a touch probe can be used that physically measures the variations from a reference point by running a probe over the wafer. Such measurement systems are commercially available, with suitable systems being available from Renishaw plc, located in Gloucestershire, United Kingdom. Other non-contact surface variation measuring devices can be used that measure surface variation by illuminating the surface of the conversion material. One example of these illumination based systems is a laser based system also available from Renishaw plc, or white light emitting Systems available from Micro Photonics, Inc.

In one embodiment, the surface variation is measured at each point to be machined, such as over each of the LEDs. This can require measurement at thousands of location depending on the number of LED chips being fabricated on the wafer. To reduce the time needed for measuring the surface variation, fewer wafer variation points can be measured with the variations between these points being theoretically determined using known software and algorithms. One such software that can be used for these calculations is JMP® Statistical Software, commercially available from SAS, Inc. This allows for variation measurement over a fraction of the LED chips with the variation over the remaining LED being determined by software algorithm. By measuring fewer locations for surface variations, the time needed to determine the surface variation profile can be reduced. This in turn can reduce the overall time needed to fabricate the wafer and individual LED chips.

Referring back to FIG. 9, in 96 the final machine map is computed taking into account the depth of the hole for each of the LEDs generated in step 92 and the measurement for surface variation over the particular LED. The general computation comprises the depth of the hole from step 92, plus or minus the surface variation depending on whether a valley or peak is measured over the LED. In the embodiment shown, the reference point for the machining tool should be the same reference point for the surface variation. For example the computation for an LED having an 11.3 micron hole depth from the hole depth data generated in 92, and a 2 micron peak from the surface variation profile, would result in a final depth for the machine map of 9.3 microns (11.3 microns−2 microns=9.3 microns). For a LED having a 9.2 micron hole depth at 3 micron valley would have a final depth for the map of 12.2 microns (9.2 microns+3 microns-12.2 microns).

This approach allows for a more controlled removal of the conversion material over the LEDs, so that the amount more accurately reflects what is needed to reach the desired emission characteristics. For the example above having an initial hole depth of 11.3 microns, if the peak was not compensated for the hole created during micro-machining would pass through the 2 micron peak and would then pass the 11.3 microns, resulting in a total hole depth of 13.3 microns. This would be more than the desired 11.3 micron hole depth and would result in too much conversion material being removed to achieve the desired emission characteristics. In the other example having a hole depth of 9.2 microns at the three micron valley, the micro-machining would not encounter conversion material until it passed the three microns into the valley. When the conversion material is encountered it would only go an additional 6.2 microns deeper (9.2 microns-3 microns). In this instance not enough conversion material would be removed. The method 10 essentially takes into account surface variations so that the desired amount of conversion material can be removed over each LED. In 50, the actual LEDs can be machined. In 98, the wafer is machined or micro-machined using the processes described above in machined/micro-machined to remove conversion material over individual, groups or regions of LEDs on the wafer using the final machine map.

In different embodiments according to the present invention the compensation computation can take place at different points in the fabrication process and in different ways. In of the computation processes is described in step 96 above, where a final machine map is computed using the hole depth map and surface variation profile. That is, the final depth map is calculated for all the LED chips before micro-machining. In other embodiments, the compensation computation can take place at the same time as micro-machining. The calculation can occur over each LED as the micro-machining tool moves to the different LED chips. Over each LED chip that hole depth and surface variation can be used to calculate the final hole depth, and the LED chip can be micro-machined to the depth. In still other embodiments, the surface variation at each LED chip can be measured as the micro-machining tool moves to the different LED chips. As the micro-machining tool moves to a new LED chip the surface variation can be measured and then the final hole depth can be calculated for that LED chip.

It is understood that many different steps can be included in different embodiments according to the present invention, and FIG. 11 shows a method 130 showing some of these additional steps. The method 130 does not show the LED fabrication and conversion material coating steps of methods 50 and 90 shown in FIGS. 5 and 9, but it is understood that these steps are completed before the steps shown in method 130. One of the additional steps in method 130 is wafer identification step completed so that the fabrication system can record the wafer it is fabricating. Many different wafer identification systems and methods can be used such as conventional bar code and scanner systems.

In 134 the wafer is probed and a wafer hole depth map is generated as described above in step 93 of the method 90 shown in FIG. 9. In step 136 the wafer is loaded on the a fabrication stage or platform, either manually or automatically, and in step 138 the wafer is aligned on the stage using different alignment systems such as pattern recognition systems that recognize a certain pattern on the wafer and utilize the pattern to properly align the wafer on the stage in the x-y planes. Even slightly misaligned wafers can result in misplacement of the holes over the LEDs. The holes may be properly aligned over the LEDs near the reference point, but for misaligned wafers the error in placement of the micro-machining holes over the LEDs can spread and magnify as the micro-machining moves out from the center of the wafer. Eventually the misalignment can lead to micro-machining misses of the desired hole over the LEDs.

In 140 the wafer is measured for surface variation and a surface profile is generated for surface variations over the wafer as in 94 above and in 142 a final machine map is computed using he methods discussed above in step 96 above. This step can take place on a computer at the wafer fabrication or machining system or at a location remote to the wafer fabrication system.

In 144 the micro-machining tool touches down on wafer, preferably on the reference point used for generating the surface variation profile. This can be important to properly implementing the compensation for surface variation by ensuring that the micro-machining tool properly aligns with the various peaks and valleys of the surface profile during micro-machining. If the micro-machine misses the reference point when it touches down, error can be introduced as the micro-machining tool moves across the wafer. In one of the embodiments discussed above, the surface profile reference point is at or near the center of the wafer. In this embodiment, the micro-machining tool touch down should also be at the same location as the central reference point. In 146 the wafer is machined or micro-machined using the processes described above in machined/micro-machined to remove conversion material over individual, groups or regions of LEDs on the wafer as described in step 50 of the method 40 above.

In 148 the wafer work area can be cleaned and the wafer unloaded from the fabrication system. Different cleaning methods and materials can be used, with suitable materials being and aqueous etch (KOH), water, air or nitrogen. The cleaning should avoid the use of oils or solvents. In 150 the wafer can be optionally probed another time to verify that the emission characteristics of the LEDs fall within the desired bin. In 152 the LEDs can be singulated from the wafer and packaged as described above in step 58 of method 40.

As described above, machining can be broadly categorized micro-machining and macro-machining with phosphor removal over areas or regions of LEDs is referred to as macro-machining, while phosphor removal over individual LEDs is termed micro-machining. Macro-machining can take different forms and can include machining over regions of LEDs in organized or prearranged regions. That is, the macro-machining regions can be determined before the wafer characteristics are measured. FIG. 12 shows one embodiment of LED wafer 170 that can be macro-machined in a prearranged region, with the regions comprising rows or tracks 172 of LEDs on the wafer. It is understood that the prearranged regions can also comprise columns of LEDs or diagonal LEDs, or other prearranged regions such as circular, oval, square, etc.

For each prearranged region the conversion material is machined to a single level. For rows 172 the conversion material is machined to a single level along the row. The methods according to the present invention calculate the desired depth for the conversion material machining to achieve that best results based on the different emission characteristics of the LEDs in each of the rows 172. The rows 172 can then be machined using the methods described above, with the machining tool moving along the row and removing conversion material to the same level. This row or track method does not provide the same conversion material removal accuracy per individual LED as the micro-machining methods described above, but provides reduced micro-machining time per wafer.

In some embodiments of the methods according to the present invention, the platform or stage upon which the wafer is placed can influence the surface variation measurements and ultimately the depth for micro-machining or macro-machining. In some instances surface variations of the stage can cause some surface variations in a wafer on the stage, and any tilt in the stage can cause tilt in the wafer, with the corresponding surface variation. Using multiple stages during measurement and machining, can result in different surface variations for the wafer from the different stages. As a result, it may be desirable to use a single stage for surface variation profile measurement and for machining.

In one embodiment, the stage can be used to measure the surface variation profile and then can be moved to the system for machining. Alternatively, the stage can be placed in a single machine that performs both the surface profile measurement and machining. Still in other systems, multiple stages can be provided that move through surface profile measurement and machining systems in assembly line fashion. The surface profile of the wafers on the stages can be measured at one point, and the stages can then be automatically moved to a second point where machining can occur. In other embodiments, multiple stages can be provided in fixed locations with the surface profile and machining systems moving between fixed locations. One such arrangement can have the multiple fixed stages arranged in a circle with the surface profile and machining systems moving between the stages from the center of the circle. This "planetary" system can allow for movement between the different stages with around a central rotation point, allowing for easier movement between the stages. In still other embodiments, the surface variation for the stage at surface profile measurement can be mimicked at the machining stage, either by having the machining stage copy the stage surface variations or by considering these variations when conducting the compensation calculations.

It is understood that the present invention can also compensate for other variations, such as those that may be introduced by the fabrication devices. For example, the micro-machining system may experience movement in along the z-axis as it moves along the x and y plane to the different LED chips on the wafer. This z-axis movement can also be compensated for when determining the final hole depth for micro-machining.

It is understood that additional steps can be included in the different embodiments of the methods according to the present invention. It is also understood that methods according to the present invention need not include all of the steps in the methods described above. For example, in method 40 the wafer can go directly to singulating following the first micro-machining, instead of being probed a second time and potentially micro-machined a second time. Similarly, the methods 90 and 130 can be performed without some of the steps described or can be performed with steps in different order.

In the embodiments mentioned above where the LEDs comprise one or more pedestals to allow electrical contact to the LED's contacts after phosphor coating, or where the LEDs are otherwise arranged to allow electrical contact following coating, different methods according to the present invention can allow for simultaneous probing and micro-machining to achieve the desired emission characteristics. That is, the micro-machining can occur while the LED is probed and is emitting. This allows for real time controlled tuning at the wafer level without the need for generating a map of the wafer level emission characteristics.

In still other embodiments, a portion of the coating can be micro-machined at the wafer level to achieve emission within an acceptable range of the target emission characteristics. Individual LEDs can then be singulated from the wafer and then packaged, such as by mounting to a substrate or submount. Based on the desired emission color point for the package, final micro-machining can be conducted at the package level. This process allows for the LEDs to be singulated and packaged, with the packages then being available for final micro-machining to meet many different color points depending on customer demand. The package micro-machining can utilize many of the steps of the methods 40, 90 and 130 mentioned above.

Figure 13A:
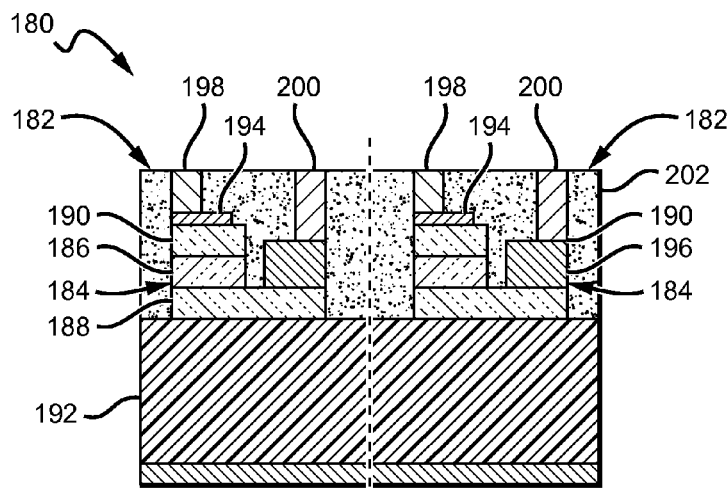
FIG. 13a is a sectional view of one embodiment of an LED chip wafer fabricated according to the present invention.
Figure 13B:
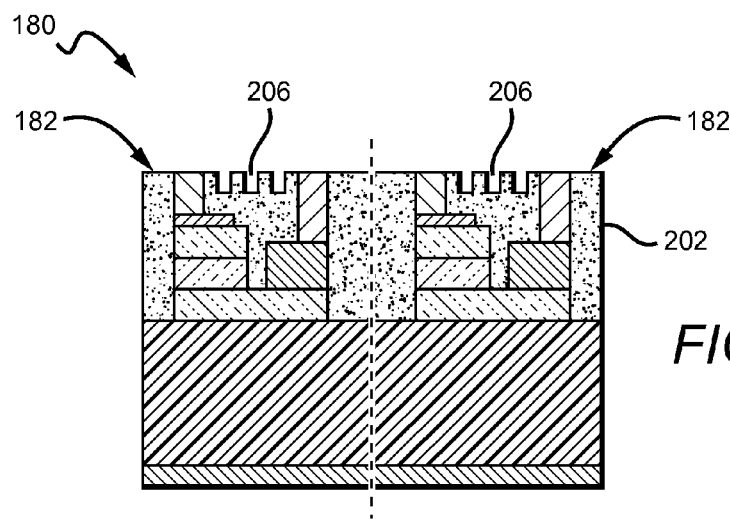
FIG. 13b is a sectional view of the LED chip wafer in FIG. 13a at a subsequent fabrication step.
Figure 13C:
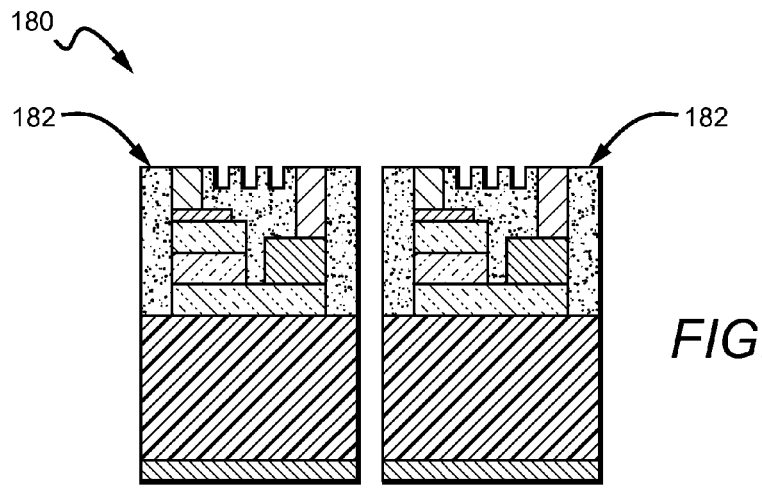
FIG. 13c is a sectional view of LED chips singulated from the LED chip wafer in FIG. 13b.

Methods according to the present invention can be utilized for machining many different devices, and FIGS. 13*a* through 13*c* show one embodiment of an LED wafer 180 processed according to the present invention. It is understood, however, that the present invention can be utilized to process many different LEDs embodiments and that individual LEDs or smaller groups of LEDs can be processed similarly to the wafer level LED. Examples of different embodiments of LEDs that can be fabricated according to the invention include commercially available EZBright™ LED chips provided by Cree, Inc. (e.g. EZ1000, EZ700, EZ600, EZ400, EXBright290), some of the details of which are described in U.S. patents Application Publication Nos. 2006/0060874 and 2006/086418, incorporated by reference as though fully set forth herein.

The details for fabrication of the LED wafer 180 are described in U.S. patent application Ser. Nos. 11/656,759 and 11/899,790, incorporated herein by reference as though fully set forth herein. Referring now to FIG. 13*a*, the LED wafer 180 comprises LEDs chips 182 shown at a wafer level of their fabrication process. Phantom lines are included to show separation or dicing line between the LED chips 182 and following additional fabrication steps. FIG. 13*a* shows only two devices at the wafer level, but it is understood that many more LED chips can be formed from a single wafer. For example, when fabricating LED chips having a 1 millimeter (mm) square size, up to 4500 LED chips can be fabricated on a 3 inch wafer.

Each of the LED chips 182 comprises a semiconductor LED 184 that can have many different semiconductor layers arranged in different ways as described above. The layers of the LEDs 184 generally comprise an active layer/region 186 sandwiched between first and second oppositely doped epitaxial layers 188, 190, all of which are formed successively on a substrate 192 at the wafer level. In the embodiment shown, the LEDs 184 are shown as separate devices on the substrate 192. This separation can be achieved by having portions of the active region 186 and doped layers 188, 190 etched down to the substrate 192 to form the open areas between the LEDs 184. In other embodiments, the active layer 86 and doped layers 188, 190 can remain continuous layers on the substrate 192 and can be separated into individual devices when the LED chips are singulated. The LEDs 184 can be made of different material systems as described above, and the substrate can be made of different materials. It is understood that additional layers and elements can also be included in the LED 184 and the active region 186 can comprise many different structures.

The LEDs 184 have lateral geometry, although it is understood that the invention is equally applicable to vertical geometry LEDs. Each of the LEDs 184 have first and second contacts 194, 196 each of which can be made of the materials described above in method 40, and each of the LEDs 184 can also comprise the current spreading layers and structures also described above. An electrical signal applied to the first contact 194 spreads into epitaxial layer 190 and a signal applied to the second contact 196 spreads into epitaxial layer 188. Because the LEDs 184 have lateral geometry, both contacts are on the top of the LEDs 184.

Each of the LED chips 182 further comprise first contact pedestal 198 formed on the first contact 194 and a second contact pedestal 200 formed on the second contact 196, both of which are utilized to make electrical contact to the LEDs 184. The pedestals 198, 200 can be formed of many different electrically conductive materials and can be formed using many different known physical or chemical deposition processes such as electroplating, mask deposition (e-beam, sputtering), electroless plating, or stud bumping, with the preferred contact pedestal being gold (Au) and formed using stud bumping which is generally known in the art. The pedestals 198, 200 can be made of other conductive materials beyond Au, such as the metals utilized for the first and second contacts including Cu, Ni, In, combinations thereof, or the conducting oxides and transparent conducting oxides listed above. The height of the pedestal 198, 200 can vary depending on the desired thickness of the phosphor loaded binder coating and should be high enough to match or extend above the top surface of the phosphor loaded binder coating from the LED.

The LED wafer 180 is blanketed by a phosphor coating 202 using the methods described above, and covers each of the LEDs 184, and its contacts 194, 196 and initially has a thickness such that it covers/buries the pedestals 198, 200. The phosphor coating 202 can then be cured using the methods described above and can comprise different binder and phosphor materials as also described above. After the initial coating of the LEDs, further processing may be needed such as planarization to thin the entire coating to expose the pedestals 198, 200 or to reduce the overall thickness of the coating 202.

Once the pedestals are exposed, the LED wafer 180 can be probed and the emission characteristics of each of the LEDs can be measured. As described above, probing can comprise making electrical contact to the exposed pedestals 198, 200 at each of the LEDs 184 and applying an electrical signal to the LEDs 184, causing them to emit light. A map of the emission characteristics of the wafer can be generated, that can be utilized to determine the amount and areas of macro or micro-machining needed for tune each of the LEDs chips 182 so that they emit at or near a target emission.

Referring now to FIG. 13*b*, the phosphor coating 202 can be machined to reduce the amount of the phosphor coating over all or some of the LED chips 182 to "tune" their emission characteristics. The amount of phosphor coating 202 to be removed can be dictated by the starting measured emission characteristics of the LED chips 182 in relation to the target emission characteristics, and can compensate for surface variations as described above. The number, spacing and depth of the machining features can be controlled to remove the desired amount of phosphor coating 202.

Different macro or micro-machining methods can be used as described above, to forms holes 206 in the phosphor coating 202, thereby removing some of the coating 202. In the embodiment shown there are multiple holes, but in one embodiment can comprise a single hole over at least some of the LEDs. Light from the LED 184 passes through the coating 202 where at least some of the light is converted by the phosphor material in the coating 202. Following machining, less of the phosphor coating 202 remains and LED light encounters less of the phosphor material. As a result, less of the LED light is converted and as the phosphor coating is machined, the LED chips 182 emit a different combination of LED light and converted light from the phosphor.

As described above, the emission characteristics for each of the LEDs 184 can be different, and the thickness of the phosphor coating 202 over each of the LEDs 184 can vary. Accordingly, the amount of phosphor coating 202 to be removed over each of the LEDs can be different to achieve the target emission. The phosphor over each LEDs 184 can be micro-machined to remove different amounts of material, such as by having holes that go to different depths in the coating, by having a different numbers of holes, or by having holes of different diameter. The holes can also be placed in an organized way to form shapes or letters.

The LED chips 182 can again be probed to determine if they emit at, or within an acceptable deviation from, the target emission. If not, the LEDs chips 182 can be further tuned through additional micro-machining. This process can continue until the LED chips 182 emit light at or near the desired characteristics.

Referring now to FIG. 13*c*, the LED chips 182 can be singulated from the LED wafer 180 using the known processes described above, into individual devices as shown, or alternatively into groups of devices. The LED chips 182 can then be packaged and contacted as described above.

Figure 14A:
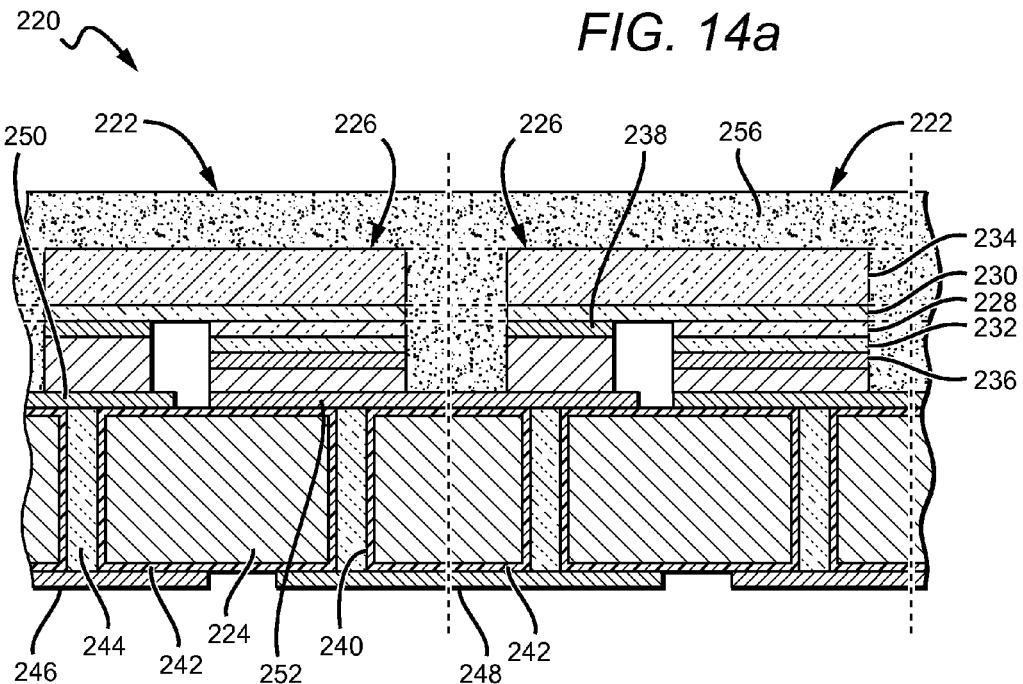
FIG. 14a is a sectional view of one embodiment of an LED chip wafer fabricated according to the present invention.
Figure 14B:
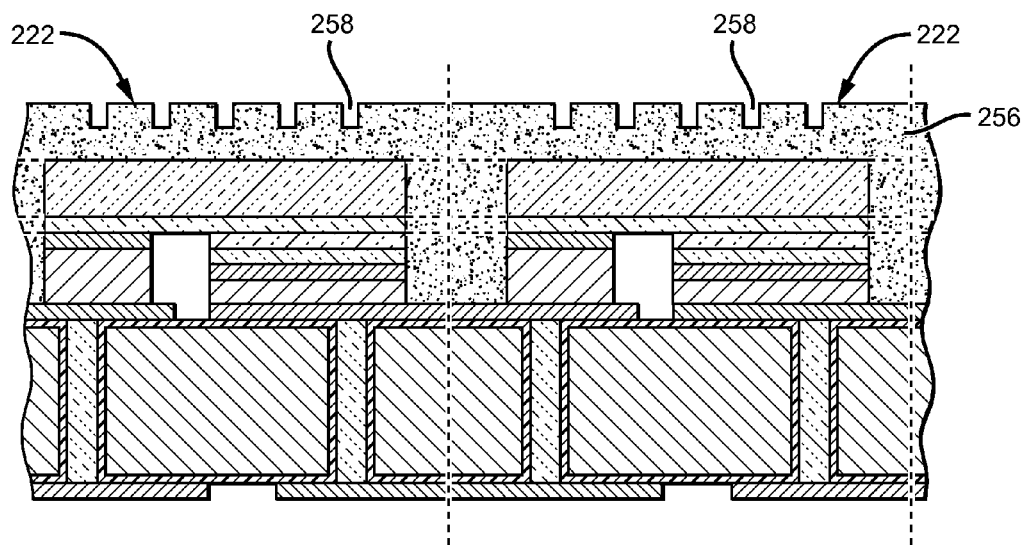
FIG. 14b is a sectional view of the LED chip wafer in FIG. 14a at a subsequent fabrication step.
Figure 14C:
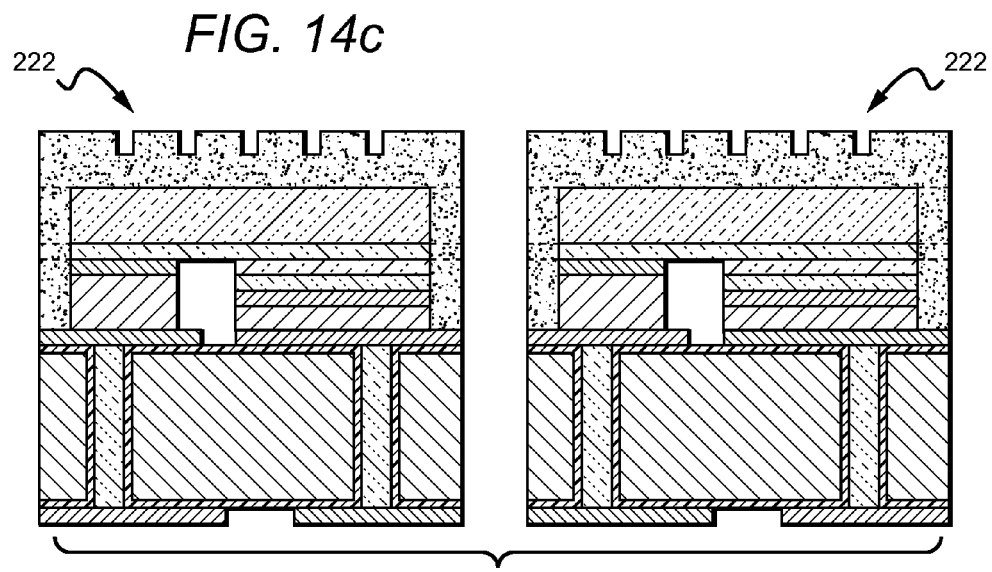
FIG. 14c is a sectional view of LED chips singulated from the LED chip wafer in FIG. 14b.

As mentioned above, the present invention can be used with many different LED wafer and LED chip structures. FIGS. 14*a* through 14*c* show another embodiment of a LED wafer 220 according to the present invention comprising. Referring first to FIG. 14*a*, the LED chips 222 that are flip-chip mounted on submount 224 at the wafer level. The LED chips 222 are shown with phantom lines to show separation or dicing line between the LED chips 222 and following additional fabrication steps. Each of the LED chips 222 comprise a semiconductor LED 226 that can have many different semiconductor layers arranged in different ways as described above. The LEDs 226 generally comprise an active layer/region 228 sandwiched between first and second oppositely doped epitaxial layers 230, 232, all of which are formed successively on a substrate 234. The present invention is particularly adapted for use with LEDs arranged so that both contacts are accessible from one surface, such as with lateral geometry LEDs. Each of the LEDs 226 further comprises first and second electrodes or contacts 236, 238 on the first and second epitaxial layers respectively. Current spreading layers and structures can be included as described above.

Each of the LED chips 222 further comprise portions of the submount 224 arranged so that the LEDs 226 can be flip-chip mounted to it. The submount 224 can be made of many different materials, such as conducting or semiconducting materials or insulating materials. Some suitable materials include ceramics such as alumina, aluminum oxide, aluminum nitride or polymide. In other embodiments the submount wafer can comprise a printed circuit board (PCB), saffire or silicon, silicon carbide, or any other suitable material, such as commercially available T-Clad thermal clad insulated substrate material. The submount wafer 224 can comprise a plurality of through-holes 240 that can be formed using known processes such as etching, with two or more of the through holes 240 arranged to cooperate with a respective one of the LEDs 226. In the embodiment shown, the through-holes 240 are arranged in sets of two, with each of the sets sized and spaced to align with the first and second contacts 236, 238 of a respective one of the LEDs 226.

A dielectric layer 242 can be included covering the surface of the submount 224, including the surfaces of the through-holes 240. The dielectric layer 242 electrically insulates the wafer such that electrical signals on the surfaces of the submount 224 do not spread into the submount 224. Different materials can be used for the dielectric layer, with suitable materials being silicon nitride or silicon oxide. For submount wafers made of an insulating material such as ceramic, it may not be necessary to include the dielectric layer or electrical isolation.

Each of the through-holes 240 can be filled with a conductive material to form conductive vias 244 through the submount 224. Each of the LED chips can have first and second bottom metal pads or traces 246, 248 on the bottom surface of its portion of the submount 224 that are arranged so that after dicing of the LED chips, they are electrically and physically separated by a space on the bottom surface. Each of the bottom traces 246, 248 is electrically coupled to a respective one of the vias 244. An electrical signal applied to the first bottom metal trace 246 is conducted to one of the LED chip's vias 244, with a signal applied to the second bottom metal trace 248 is conducted to the other of the LED chip's vias 244. First and second top traces 250, 252 can be included on the top surface of the submount 224 for conducting signals from the vias 244 to the first and second contacts 236, 238. The LEDs 226 are mounted to the submount 224 by a conductive bond material 254, which is typically one or more bond/metal layers such as solder. The bond material typically bonds the first top trace 250 to the first contact 236 and the second top trace 252 to the second contact 238.

The LED wafer 220 can be covered by a phosphor/binder coating 256 that covers the LEDs 226 for each of the LED chips 222. The phosphor binder coating can comprise the binder and phosphor materials described above and can be applied, cured and planarized as described above. The LEDs wafer 220 can then be probed by contacting the first and second bottom traces 246, 248, causing the LEDs 226 to emit light. A map can be made of the emission characteristics of the LED chips across the wafer.

Referring now to FIG. 14b the phosphor/binding coating 256 can be macro or micro-machined using any one of the methods described above to "tune" the emission characteristics of each of the LEDs chips 222. In the embodiment shown, the micro-machining forms holes 258 in the coating 256, thereby removing phosphor material. It is understood that the coating can be removed in other ways beyond holes. The LED chips 222 can again be probed to measure their output characteristics and can again be micro-machined as needed so that the LED chips emit at or near a target emission characteristic. Referring now to FIG. 14c, the LED chips 222 can then be singulated from the LED wafer individually or as groups of LED chips 222. The LED chips 222 can then be further packaged as described above.

Figure 15:
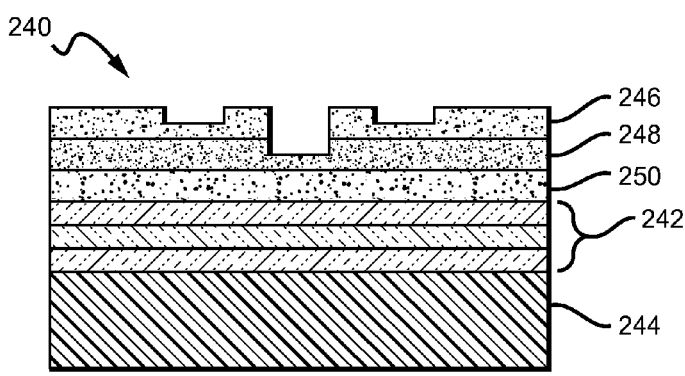
FIG. 15 is a sectional view of one embodiment of an LED chip according to the present invention having multiple phosphor/binder coatings.

FIG. 15 shows another embodiment of an LED chip 240 according to the present invention whose emission characteristics can also be tuned using the methods described above, either at the wafer level or LED chip level. The LED chip 240 comprises semiconductor layers 242 forming LEDs on the substrate/waver 244. First, second and third phosphor/binder coatings 246, 248, 250 formed on the semiconductor layers. In one embodiment the phosphor/binder coatings can 246, 248, 250 absorb LED light and emit colors that combine to white light, with the coatings in one embodiment emitting red, green and blue light. The coatings can be machined using the methods described above to tune the color point of the LED chip's white light emission.

Figure 16:
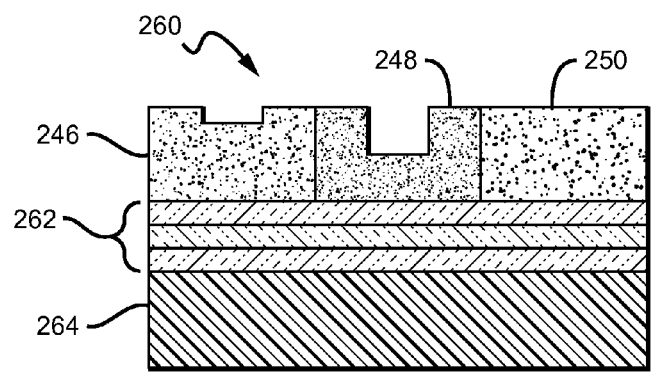
FIG. 16 is a sectional view of another embodiment of an LED chip according to the present invention having multiple phosphor/binder regions.

FIG. 16 shows still another embodiment of an LED chip 260 according to the present invention having semiconductor layers 262 forming LEDs on a substrate/wafer 264. In this embodiment, instead of three phosphor/binder coatings, the LED chip 260 has first, second and third lateral phosphor/binder regions 246, 248, 250 that absorb LED light and emit a white light combination. In this embodiment the regions emit red, green and blue light that combines so that the LED chip emits white light. Each of the regions can be machined using the methods above to remove conversion material from any one of the regions to the LED chip's color point. It is understood that the methods described above can be used to machine LED chips having phosphor regions with different combinations of lateral regions or layers to tune the emission characteristics.

Figure 17:
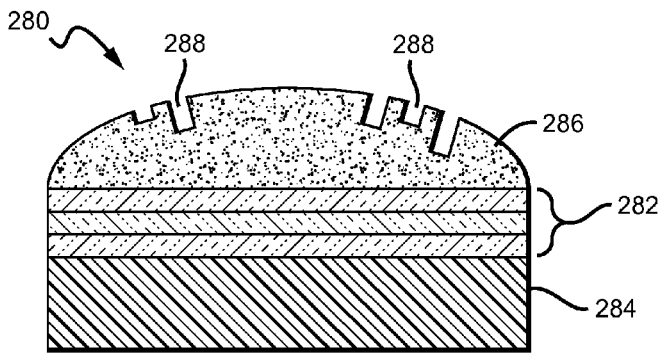
FIG. 17 is a sectional view of one embodiment of an LED chip according to the present invention having a shaped phosphor/binder coating.

The machining according to the present invention can also be used to shape or texture the phosphor/binder coating or other layers of LED chips to enhance light extraction or to shape the LED chip's emission pattern. FIG. 17 shows another embodiment of an LED chip 280 according to the present invention having semiconductor layers 282 on a substrate/wafer 284, with a phosphor/binder coating 286 on the semiconductor layers. Machining of the phosphor/binder coating 286 can both remove phosphor material and shape the coating. For the LED chip 280 the machining removes phosphor material and forms the binder coating a lens shape over the semiconductor layers. In one embodiment the desired amount of conversion material can be removed when forming the lens, while in other additional conversion material can be removed such as by forming holes 288 in the lens shaped conversion material to remove the conversion material.

It is understood that the holes described with reference to the different embodiments can take many different shapes and can be arranged in many different ways beyond those described herein. The holes can different depths, different diameters, and shapes beyond cylindrical, and can have different features such as texturing or contours. The holes can have shapes and features to alter the emission pattern of the LED chips or the holes can be provided at an angle to alter the emission pattern of the LED chips. The holes can also have the same or different angles.

Figure 18:
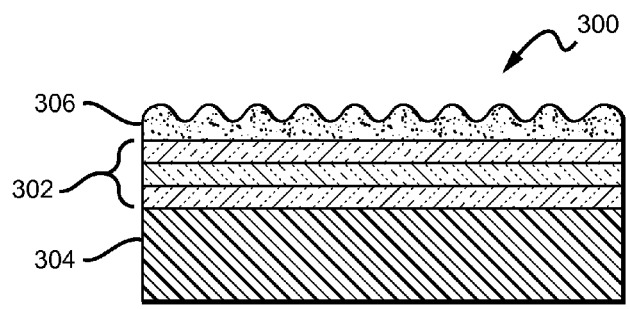
FIG. 18 is a sectional view of another embodiment of an LED chip according to the present invention having a shaped phosphor/binder coating.

FIG. 18 shows still another embodiment of a LED chip 300 having semiconductor layers 302, a substrate/wafer 304, and phosphor/binder coating 306. In this embodiment, the machining can not only remove conversion material, but it can also texture the surface of the phosphor/binder coating 306 to enhance light extraction. The phosphor/binder can have many different shapes and surface textures beyond those shown in FIGS. 17 and 18, and can also have conversion material removed, such as by holes.

Although the present invention has been described in detail with reference to certain preferred configurations thereof, other versions are possible. For example, the present invention can be used with many different device configurations (geometries, shape, size and other elements on, in and around the chip) to improve device performance. Therefore, the spirit and scope of the invention should not be limited to the versions described above.

We claim:

1. A method for fabricating light emitting diode (LED) chips, comprising:
   fabricating a plurality of LEDs on a growth wafer;
   forming a plurality of LED chips by coating said LEDs on said growth wafer with a conversion material so that at least some light from said LEDs passes through said conversion material and is converted, wherein each of said LED chips comprises an LED and a portion of said conversion material;
   measuring the emission characteristics of at least some of said LED chips; and
   removing at least some of said conversion material from each of a group of LED chips emitting outside a target range of emission characteristics to alter the emission characteristics of each of said group of LED chips such that each of said LED chips emits within said range of target emission characteristics.

2. The method of claim 1, further comprising generating a surface variation profile of said LEDs.

3. The method of claim 2, further comprising compensating for said surface variation profile when determining how much conversion material is to be removed over said LEDs.

4. The method of claim 1, further comprising determining the amount of conversion material to be removed based on the emission characteristics of said LED chips relative to a range of target emission characteristics.

5. The method of claim 1, wherein the output of said LED chips is altered by said removal of said conversion material to change the emission characteristics of said LED chips such that the emission characteristics of said LED chips are within a range of target emission characteristics.

6. The method of claim 1, further comprising measuring the emission characteristics of at least some of said LEDs a second time following said conversion material removal.

7. The method of claim 6, further comprising removing of at least some of said conversion material a second time over at least some of said LEDs to alter the emission characteristics of said LED chips.

8. The method of claim 1, further comprising generating a map of the emission characteristics of said plurality of LEDs.

9. The method of claim 8, wherein the amount of said conversion material to be removed over the respective ones of said LEDs is determined from said emission characteristic map compared to a target emission characteristic for said LED chips.

10. The method of claim 1, wherein said removal of said conversion material comprises macro-machining.

11. The method of claim 1, wherein said removal of said conversion material comprises micro-machining.

12. The method of claim 1, wherein said removal of said conversion material comprises micro-drilling.

13. The method of claim 1, wherein said removal of said conversion material comprises micro-drilling to a sub-micron depth.

14. The method of claim 13, further comprising measuring a surface variation of said conversion material and compensating for said surface variation when micro-drilling.

15. The method of claim 13, wherein said micro drilling comprises moving said wafer at sub-micron increments in relation to a micro drill.

16. The method of claim 13, where said wafer is moved at sub-micron increments by a nano-stage.

17. The method of claim 1, further comprising generating a map of regions with similar emission characteristics follows said measuring of the emission characteristics, further comprising macro level removal of conversion material over said regions prior to said removal of conversion material over at least some of said LEDs.

18. The method of claim 1, where said measuring of said emission characteristics is performed at the same time as said removal of at least some of said conversion material.

19. The method of claim 1, further comprising planarizing said coating over said LEDs before said measuring of said emission characteristics.

20. A method for fabricating light emitting diode (LED) chips, comprising:
    providing a plurality of LEDs on a wafer;
    coating said LEDs with a conversion material so that at least some light from said LEDs passes through said conversion material and is converted;
    measuring the emission characteristics of at least some of said LED chips;
    measuring the surface variations for the conversion material coating on said wafer;
    calculating the amount of conversion material that needs to be removed over at least some of said LEDs based on the measured emission characteristics and surface variation profile, to alter the emission characteristics of said LED chips such that said LED chips emit within a range of target emission characteristics; and
    removing the calculated amount of conversion material.

* * * * *